(12) United States Patent
Majjigi et al.

(10) Patent No.: US 9,197,166 B2
(45) Date of Patent: *Nov. 24, 2015

(54) INCREASING POWER AMPLIFIER LINEARITY TO FACILITATE IN-DEVICE COEXISTENCE BETWEEN WIRELESS COMMUNICATION TECHNOLOGIES

(71) Applicant: Apple Inc., Cupertino, CA (US)

(72) Inventors: Vinay R. Majjigi, Sunnyvale, CA (US); William S. Burchill, San Jose, CA (US); Xiaowen Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 472 days.

This patent is subject to a terminal disclaimer.

(21) Appl. No.: 13/628,014

(22) Filed: Sep. 26, 2012

(65) Prior Publication Data
US 2014/0087664 A1    Mar. 27, 2014

(51) Int. Cl.
| | |
|---|---|
| *H04W 52/02* | (2009.01) |
| *H04W 52/24* | (2009.01) |
| *H04W 52/28* | (2009.01) |
| *H03F 1/02* | (2006.01) |
| *H04W 52/52* | (2009.01) |
| *H03F 1/32* | (2006.01) |
| *H03F 3/195* | (2006.01) |
| *H03F 3/24* | (2006.01) |

(52) U.S. Cl.
CPC ............ *H03F 1/0261* (2013.01); *H03F 1/3205* (2013.01); *H03F 3/195* (2013.01); *H03F 3/245* (2013.01); *H04W 52/52* (2013.01); *Y02B 60/50* (2013.01)

(58) Field of Classification Search
CPC .................. H04B 1/0475; H04B 1/10; H04B 2001/1045; H04B 15/02; H04B 17/354; H04W 52/0238; H04W 24/04
See application file for complete search history.

(56) References Cited

U.S. PATENT DOCUMENTS

| | | | |
|---|---|---|---|
| 8,335,535 B2 | 12/2012 | Iseda | |
| 8,781,519 B2 * | 7/2014 | Burchill et al. | 455/522 |
| 2002/0146985 A1 | 10/2002 | Naden | |
| 2007/0037548 A1 | 2/2007 | Sammour et al. | |
| 2007/0183392 A1 | 8/2007 | Tandai et al. | |

(Continued)

FOREIGN PATENT DOCUMENTS

| | | |
|---|---|---|
| JP | 2004363728 | 12/2004 |
| JP | 2006352524 | 12/2006 |

(Continued)

OTHER PUBLICATIONS

International Search Report and Written Opinion for PCT Application PCT/US2012/057397, dated Feb. 27, 2013.

(Continued)

*Primary Examiner* — Andrew Wendell
(74) *Attorney, Agent, or Firm* — Downey Brand LLP

(57) ABSTRACT

A method of increasing power amplifier linearity to facilitate in-device coexistence between wireless communication technologies is provided. The method can include determining a scheduled time period during which data is received by a device via a first wireless communication technology. The method can further include adjusting an operational parameter of a power amplifier applied to a transmission from the device via a second wireless communication technology to increase a linearity of the power amplifier during the scheduled time period.

26 Claims, 16 Drawing Sheets

(56) References Cited

U.S. PATENT DOCUMENTS

| | | |
|---|---|---|
| 2010/0067469 A1 | 3/2010 | Gaal et al. |
| 2010/0273481 A1 | 10/2010 | Meshkati et al. |
| 2011/0009060 A1 | 1/2011 | Hsu et al. |
| 2011/0081858 A1 | 4/2011 | Tolentino et al. |
| 2011/0274080 A1 | 11/2011 | Ko et al. |
| 2011/0319125 A1 | 12/2011 | Nakano |
| 2012/0021707 A1 | 1/2012 | Forrester et al. |
| 2012/0071106 A1 | 3/2012 | Kadous et al. |
| 2012/0164948 A1 | 6/2012 | Narasimha et al. |
| 2012/0176923 A1 | 7/2012 | Hsu et al. |
| 2013/0045688 A1 | 2/2013 | Banerjea et al. |
| 2013/0065525 A1 | 3/2013 | Kiukkonen et al. |
| 2013/0316758 A1 | 11/2013 | Uchino et al. |
| 2013/0324049 A1 | 12/2013 | Mujtaba et al. |
| 2013/0331137 A1 | 12/2013 | Burchill et al. |
| 2014/0087664 A1 | 3/2014 | Majjigi et al. |
| 2015/0018029 A1* | 1/2015 | Burchill et al. ............... 455/522 |

FOREIGN PATENT DOCUMENTS

| | | |
|---|---|---|
| JP | 2007214819 | 8/2007 |
| JP | 2012169873 | 9/2012 |
| KR | 10-2010-0032442 | 3/2010 |
| WO | WO 2012096949 A1 | 7/2012 |
| WO | WO2012122116 | 9/2012 |

OTHER PUBLICATIONS

Japanese Patent Application No. 2014-539957—Office Action dated Apr. 27, 2015.

* cited by examiner

INCREASING POWER AMPLIFIER LINEARITY TO FACILITATE IN-DEVICE COEXISTENCE BETWEEN WIRELESS COMMUNICATION TECHNOLOGIES

FIELD OF THE DESCRIBED EMBODIMENTS

The described embodiments relate generally to wireless communications and more particularly to increasing power amplifier linearity to facilitate in-device coexistence between wireless communication technologies.

BACKGROUND

Many wireless communication devices support multiple wireless communication technologies and may concurrently communicate via multiple wireless communication technologies. In many instances, wireless communication technologies used by a device use channel bands that may interfere with each other. In such instances, energy from a band used by one technology can leak into a band used by another technology. This energy leakage can raise the noise floor and cause a problem known as desense. In many instances, desense can negatively impact the use of certain channel bands and, in severe cases, can render certain channel bands unusable. Accordingly, interference that can result in desense poses a problem for in-device coexistence of multiple wireless communication technologies.

A particularly troublesome desense problem can result in a scenario in which a device emits a transmission via a first wireless communication technology, referred to as an aggressor technology, while the device is receiving data via a second wireless communication technology, referred to as a victim technology. Data receipt by the victim technology can be damaged by the aggressor transmission, particularly in instances in which the aggressor technology uses a relatively high transmission power. In this regard, received packet errors, or even complete deafening of the victim technology receiver can result from the interference that can be caused by the aggressor technology transmission. For example transmission of a cellular signal by a device at a time when a Bluetooth signal is received can deafen the Bluetooth receiver, causing errors and, in some cases, complete loss of the Bluetooth connection.

SUMMARY OF THE DESCRIBED EMBODIMENTS

Some embodiments disclosed herein reduce the occurrence of channel interference, including adjacent channel interference, blocker interference, out-of-band emissions, and harmonic interference. In this regard, some example embodiments provide for transmission power modulation of transmissions by an aggressor wireless technology during a time period in which data is received via a victim technology. Additionally or alternatively, some example embodiments provide for increasing a linearity of a power amplifier applied to a transmission via an aggressor wireless technology during a time period in which data is received via a victim technology. Accordingly, such embodiments facilitate in-device coexistence between wireless communication technologies. Devices implementing various embodiments disclosed herein can experience reduced loss and corruption of received data due to reduced interference, and thus a reduced occurrence of desense. Further, devices sending data to a device implementing an embodiment disclosed herein can experience benefits due to a reduction in lost data and, consequently, reduced retransmission of data.

In a first embodiment, a method is provided. The method of the first embodiment can include determining a scheduled time period during which data is received by a device via a first wireless communication technology; reducing a transmission power of a transmission from the device via a second wireless communication technology to a threshold level prior to the scheduled time period and controlling the transmission power during the scheduled time period so that the transmission power does not exceed the threshold level; and subsequent to the scheduled time period, increasing the transmission power to a level exceeding the threshold level.

In a second embodiment, an apparatus is provided. The apparatus of the second embodiment can include a first transceiver configured to emit transmissions via a first wireless communication technology and processing circuitry coupled to the first wireless transceiver. The processing circuitry can be configured to determine a scheduled time period during which data is received by a second wireless transceiver via a second wireless communication technology; reduce a transmission power of a transmission emitted by the first wireless transceiver prior to the scheduled time period and control the transmission power during the scheduled time period so that the transmission power does not exceed the threshold level; and subsequent to the scheduled time period, increase the transmission power to a level exceeding the threshold level.

In a third embodiment, a computer program product is provided. The computer program product of the third embodiment can include at least one non-transitory computer readable storage medium having program code stored thereon. The program code can include program code for determining a scheduled time period during which data is received by a device via a first wireless communication technology; program code for reducing a transmission power of a transmission from the device via a second wireless communication technology to a threshold level prior to the scheduled time period and controlling the transmission power during the scheduled time period so that the transmission power does not exceed the threshold level; and program code for, subsequent to the scheduled time period, increasing the transmission power to a level exceeding the threshold level.

In a fourth embodiment, an apparatus is provided that can include means for determining a scheduled time period during which data is received by a device via a first wireless communication technology; means for reducing a transmission power of a transmission from the device via a second wireless communication technology to a threshold level prior to the scheduled time period and controlling the transmission power during the scheduled time period so that the transmission power does not exceed the threshold level; and means for, subsequent to the scheduled time period, increasing the transmission power to a level exceeding the threshold level.

In a fifth embodiment, a method is provided. The method of the fifth embodiment can include determining a scheduled time period during which data is received by a device via a first wireless communication technology; determining that a transmission power of a transmission from the device via a second wireless communication technology should be reduced to a threshold level during the scheduled time period so that transmission via the second wireless communication technology does not inhibit data reception via the first wireless communication technology during the scheduled time period; and sending a message including an indication of the scheduled time period to a control module for the second wireless communication technology in advance of the scheduled time period to request that the control module reduce the transmission power to the threshold level prior to the scheduled time period and control the transmission power so that it does not exceed the threshold level during the scheduled time period.

In a sixth embodiment, an apparatus is provided. The apparatus of the sixth embodiment can include a first transceiver configured to receive data via a first wireless communication technology and processing circuitry coupled to the first wireless transceiver. The processing circuitry can be configured to determine a scheduled time period during which data is received by the first wireless transceiver; determine that a transmission power of a transmission by a second wireless transceiver via a second wireless communication technology should be reduced to a threshold level during the scheduled time period so that transmission by the second wireless transceiver does not inhibit data reception via the first wireless communication technology during the scheduled time period; and send a message to a control module configured to control the second wireless transceiver, the message including an indication of the scheduled time period to request that the control module reduce the transmission power to the threshold level prior to the scheduled time period and control the transmission power so that it does not exceed the threshold level during the scheduled time period.

In a seventh embodiment, a computer program product is provided. The computer program product of the seventh embodiment can include at least one non-transitory computer readable storage medium having program code stored thereon. The program code can include program code for determining a scheduled time period during which data is received by a device via a first wireless communication technology; program code for determining that a transmission power of a transmission from the device via a second wireless communication technology should be reduced to a threshold level during the scheduled time period so that transmission via the second wireless communication technology does not inhibit data reception via the first wireless communication technology during the scheduled time period; and program code for sending a message including an indication of the scheduled time period to a control module for the second wireless communication technology in advance of the scheduled time period to request that the control module reduce the transmission power to the threshold level prior to the scheduled time period and control the transmission power so that it does not exceed the threshold level during the scheduled time period.

In an eighth embodiment, an apparatus is provided that can include means for determining a scheduled time period during which data is received by a device via a first wireless communication technology; means for determining that a transmission power of a transmission from the device via a second wireless communication technology should be reduced to a threshold level during the scheduled time period so that transmission via the second wireless communication technology does not inhibit data reception via the first wireless communication technology during the scheduled time period; and means for sending a message including an indication of the scheduled time period to a control module for the second wireless communication technology in advance of the scheduled time period to request that the control module reduce the transmission power to the threshold level prior to the scheduled time period and control the transmission power so that it does not exceed the threshold level during the scheduled time period.

In a ninth embodiment, an apparatus is provided that can include first control circuitry for a first wireless communication technology; second control circuitry for a second wireless communication technology; and an interface configured to enable communication between the first control circuitry and the second control circuitry. The first control circuitry can be configured to determine a scheduled time period during which data is received by a device via a first wireless communication technology and send a message over the interface to the second control circuitry to request that the second control circuitry reduce a transmission power of a transmission via the second wireless communication technology to a threshold level during the scheduled time period. The second control circuitry can be configured to receive the message sent over the interface by the first control circuitry and, in response to the message, to reduce the transmission power to the threshold level prior to the scheduled time period and control the transmission power during the scheduled time period so that the transmission power does not exceed the threshold level.

In a tenth embodiment, a method is provided. The method of the tenth embodiment can include determining a scheduled time period during which data is received by a device via a first wireless communication technology; and adjusting an operational parameter of a power amplifier applied to a cellular transmission from the device to increase a linearity of the power amplifier during the scheduled time period.

In an eleventh embodiment, an apparatus is provided. The apparatus of the eleventh embodiment can include a first transceiver configured to emit transmissions via a first wireless communication technology and processing circuitry coupled to the first wireless transceiver. The processing circuitry can be configured to determine a scheduled time period during which data is received by a second wireless transceiver via a second wireless communication technology; and adjust an operational parameter of a power amplifier applied to a cellular transmission from the device to increase a linearity of the power amplifier during the scheduled time period.

In a twelfth embodiment, a computer program product is provided. The computer program product of the twelfth embodiment can include at least one non-transitory computer readable storage medium having program code stored thereon. The program code can include program code for determining a scheduled time period during which data is received by a device via a first wireless communication technology; and program code for adjusting an operational parameter of a power amplifier applied to a cellular transmission from the device to increase a linearity of the power amplifier during the scheduled time period.

In a thirteenth embodiment, an apparatus is provided that can include means for determining a scheduled time period during which data is received by a device via a first wireless communication technology; and means for adjusting an operational parameter of a power amplifier applied to a cellular transmission from the device to increase a linearity of the power amplifier during the scheduled time period.

In a fourteenth embodiment, a method is provided. The method of the fourteenth embodiment can include determining a scheduled time period during which data is received by a device via a first wireless communication technology; determining that a linearity of a power amplifier applied to a transmission from the device via a second wireless communication technology should be increased during the scheduled time period so that transmission via the second wireless communication technology does not inhibit data reception via the first wireless communication technology during the scheduled time period; and sending a message including an indication of the scheduled time period to a control module for the second wireless communication technology in advance of the scheduled time period to request that the control module increase the linearity of the power amplifier during the scheduled time period.

In a fifteenth embodiment, an apparatus is provided. The apparatus of the fifteenth embodiment can include a first transceiver configured to receive data via a first wireless communication technology and processing circuitry coupled to the first wireless transceiver. The processing circuitry can be configured to determine a scheduled time period during which data is received by the first wireless transceiver; determine that a linearity of a power amplifier applied to a transmission from the device via a second wireless communication technology should be increased during the scheduled time period so that transmission via the second wireless communication technology does not inhibit data reception via the first wireless communication technology during the scheduled time period; and send a message to a control module configured to control the second wireless transceiver, the message including an indication of the scheduled time period to request that the control module increase the linearity of the power amplifier during the scheduled time period.

In a sixteenth embodiment, a computer program product is provided. The computer program product of the sixteenth embodiment can include at least one non-transitory computer readable storage medium having program code stored thereon. The program code can include program code for determining a scheduled time period during which data is received by a device via a first wireless communication technology; program code for determining that a linearity of a power amplifier applied to a transmission from the device via a second wireless communication technology should be increased during the scheduled time period so that transmission via the second wireless communication technology does not inhibit data reception via the first wireless communication technology during the scheduled time period; and program code for sending a message including an indication of the scheduled time period to a control module for the second wireless communication technology in advance of the scheduled time period to request that the control module increase the linearity of the power amplifier during the scheduled time period.

In a seventeenth embodiment, an apparatus is provided that can include means for determining a scheduled time period during which data is received by a device via a first wireless communication technology; means for determining that a linearity of a power amplifier applied to a transmission from the device via a second wireless communication technology should be increased during the scheduled time period so that transmission via the second wireless communication technology does not inhibit data reception via the first wireless communication technology during the scheduled time period; and means for sending a message including an indication of the scheduled time period to a control module for the second wireless communication technology in advance of the scheduled time period to request that the control module increase the linearity of the power amplifier during the scheduled time period.

In an eighteenth embodiment, an apparatus is provided that can include first control circuitry for a first wireless communication technology; second control circuitry for a second wireless communication technology; and an interface configured to enable communication between the first control circuitry and the second control circuitry. The first control circuitry can be configured to determine a scheduled time period during which data is received by a device via a first wireless communication technology and send a message over the interface to the second control circuitry to request that the second control circuitry increase a linearity of a power amplifier applied to a transmission via the second wireless communication technology during the scheduled time period. The second control circuitry can be configured to receive the message sent over the interface by the first control circuitry and, in response to the message, to adjust an operational parameter of the power amplifier to increase the linearity of the power amplifier during the scheduled time period.

The above summary is provided merely for purposes of summarizing some example embodiments so as to provide a basic understanding of some aspects of the disclosure. Accordingly, it will be appreciated that the above described example embodiments are merely examples and should not be construed to narrow the scope or spirit of the disclosure in any way. Other embodiments, aspects, and advantages will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings are not necessarily drawn to scale, and in no way limit any changes in form and detail that may be made to the described embodiments by one skilled in the art without departing from the spirit and scope of the described embodiments.

DETAILED DESCRIPTION OF SELECTED EMBODIMENTS

Representative applications of systems, methods, apparatuses, and computer program products according to the instant specification are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Some example embodiments address an in-device coexistence problem between wireless communication technologies. More particularly, some example embodiments described further herein address a situation in which a transmission is emitted by a device via an aggressor technology while the device is to receive data via a victim technology. In such situations, the aggressor technology transmissions can inhibit data reception via the victim technology, potentially resulting in received data errors, or in extreme cases, even completely deafening the victim technology receiver. For example, victim technology data reception can suffer from blocker interference in which the victim technology receiver can capture a high-power signal from an aggressor technology transmission that can desense the victim signal. As another example, victim technology data reception can suffer from interference from out-of-band (OOB) emissions in which an aggressor technology transmission can be in a band adjacent to nearby the victim technology band and the aggressor technology transmission can leak power into the victim technology band, thus raising the noise floor for the victim technology data reception. As a further example, victim technology data reception can suffer from interference from harmonics in which an aggressor technology transmission can result in harmonics from non-linear behavior placing an interfering power into the victim technology band. Various example embodiments disclosed herein and described further herein below can reduce the effects of blocker interference, OOB interference, and harmonics interference.

Figure 1:
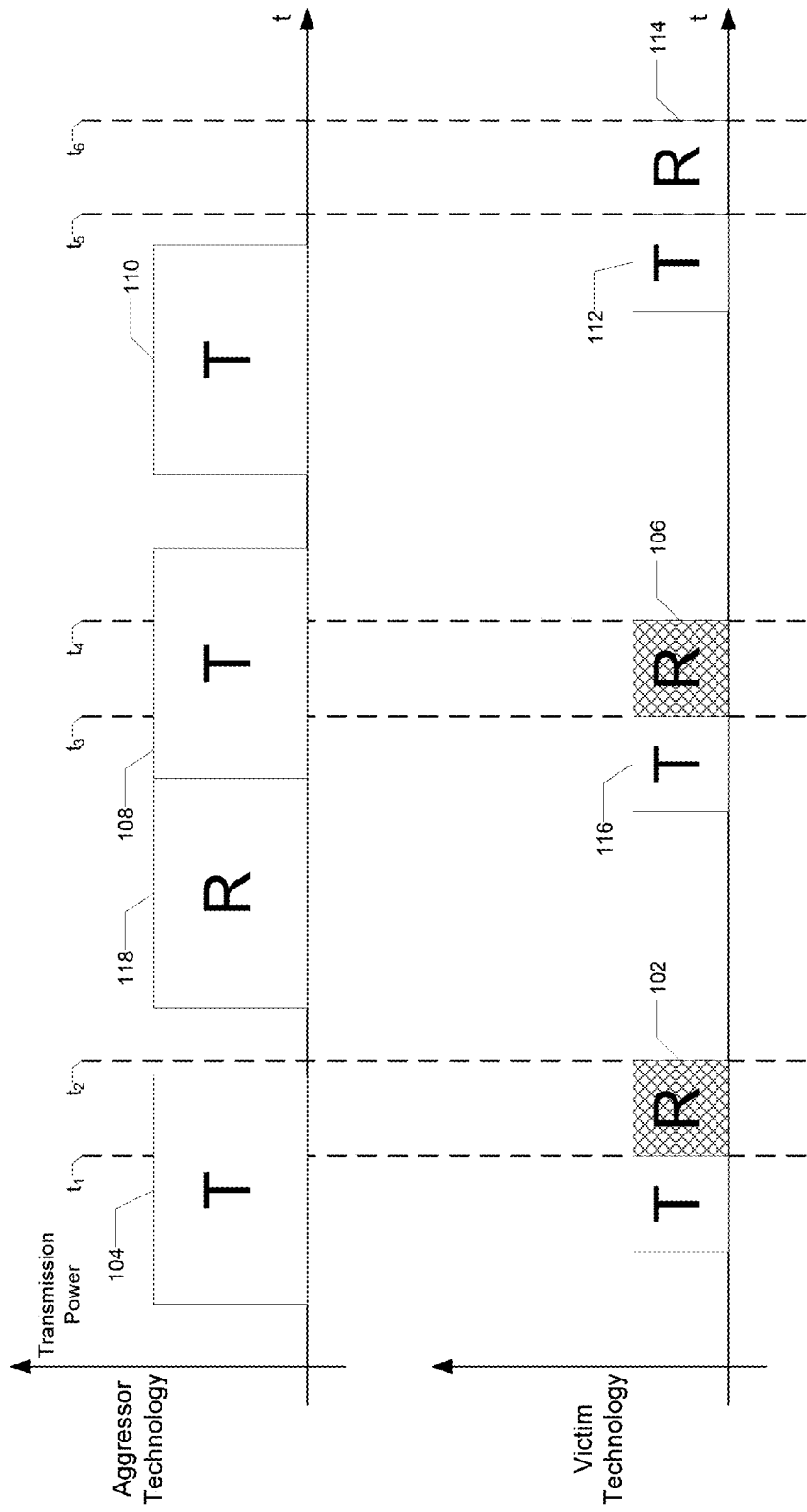
FIG. 1 illustrates a prior art time domain view of an in-device coexistence problem between wireless communication technologies that can be addressed by various example embodiments.

FIG. 1 illustrates a prior art time domain view of an in-device coexistence problem in which transmissions are emitted via an aggressor technology while data is received by a victim technology that can be addressed by various example embodiments. In this regard, FIG. 1 illustrates a time domain sequence of reception ("R") and transmission ("T") periods for an aggressor technology and a victim technology that can be implemented on a mobile communication device and/or on other device configured to engage in wireless communications via multiple wireless communication technologies. It may be seen in FIG. 1 that data reception 102 is scheduled to occur between time $t_1$ and time $t_2$. However, as illustrated a transmission 104 via the aggressor technology occurs during a portion of the time period between $t_1$ and $t_2$. As such, the data reception 102 can be damaged, as indicated by the cross-hatched pattern on the illustration of data reception 102. Similarly, data reception 106 can also be damaged, as the transmission 108 via the aggressor technology overlaps the entirety of the time period between $t_3$ and $t_4$ during which the data reception 106 occurs. However, data reception 114 may proceed uninhibited, as the transmission 110 via the aggressor technology does not overlap the time period between $t_5$ and $t_6$ during which the data reception 106 occurs.

Concurrent transmissions via multiple wireless communication technologies can, in many instances, proceed without damaging reception via desense. Thus, for example, overlapping transmissions 110 and 112 can proceed without interference damaging either transmission. Further, in the example scenario illustrated in FIG. 1, the transmission power of transmissions via the aggressor technology can be much greater than the transmission power of transmissions via the victim technology. Thus, while transmissions via the aggressor technology can inhibit concurrent reception via the victim technology, transmissions via the victim technology may not impact a concurrent reception via the aggressor technology. Thus, for example, while the transmission 116 via the victim technology overlaps the reception 118 via the aggressor technology, the reception 118 may not be inhibited by the transmission 116.

The example illustrated in FIG. 1 illustrates a common problem when a device communicates concurrently via cellular communications and a lower powered communication technology utilizing an industrial, scientific, and medical (ISM) band, such as Bluetooth. In such scenarios, the cellular transmissions can be much stronger than the Bluetooth transmissions. Accordingly, Bluetooth transmissions may not significantly impact cellular reception. However, cellular transmissions can prevent reception of Bluetooth packets.

In many instances, receptions via a victim technology are scheduled, and it may not be possible to shift scheduled reception intervals around transmissions via an aggressor technology. Similarly, the timing of transmissions via an aggressor technology can be fixed according to a schedule. For example, in instances in which the aggressor technology is a cellular communications technology, the timing of cellular transmissions by a device can be set by the cellular base station, which may not have any knowledge of scheduled reception periods for Bluetooth or other potential victim technology. Accordingly, collisions between cellular transmissions and victim technology reception periods, such as data reception periods 102 and 106 illustrated in the example of FIG. 1 can result.

Several example embodiments described herein can address the problem illustrated in and described with respect to FIG. 1. In this regard, some example embodiments provide for determining a scheduled time period during which data is received via a victim technology and reduce a transmission power of a transmission via an aggressor technology such that it does not exceed a threshold level during the scheduled time period. The threshold level can be chosen such that the transmission via the aggressor technology does not inhibit concurrent data reception via the victim technology. In this regard, the threshold level can be chosen such that the transmission via the aggressor technology does not introduce errors in data received via the victim technology, prevent reception of data via the victim technology, or otherwise damage data reception via the victim technology. Further, the threshold level can be a transmission power level that is still sufficient to support successful transmission via the aggressor technology.

In this regard, it may not be necessary to eliminate desense energy to protect the data received via the victim technology. Instead, it can be sufficient to decrease the desense energy below an acceptable threshold, such as may determined by the applicable specification, packet type, and/or other factors, which will be discussed further herein. Further, the presence of desense is due largely to second order nonlinearities in the aggressor technology transmit chain. Thus, when the aggressor transmission power is reduced by some amount, the unwanted adjacent band power can reduced by a significantly larger amount (due to the nonlinear relationship). As such, a relatively modest reduction in aggressor technology transmission power can enable successful reception via the victim technology by preventing victim technology desense that can be caused by blocker interference and OOB interference.

In some example embodiments, the transmission power of the aggressor transmission can be reduced to the threshold level prior to the scheduled time period during which a data reception is to occur via the victim technology. Subsequent to the time period, if transmission via the aggressor technology is still occurring, the transmission power can be increased back to a level exceeding the threshold level. As such, reception via the victim technology can proceed without being damaged by the aggressor transmission, which can also proceed as scheduled.

Figure 2:
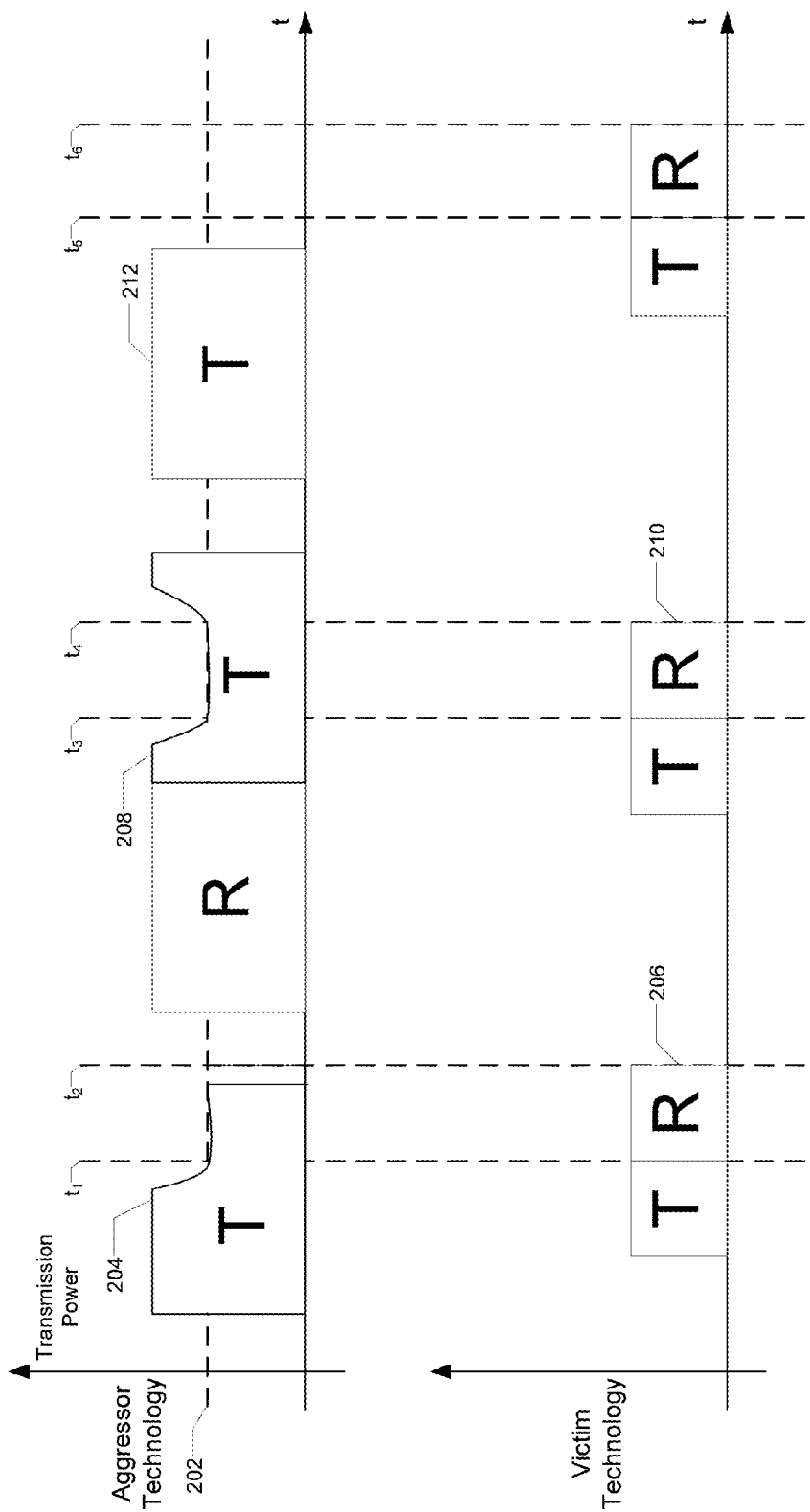
FIG. 2 illustrates an example time domain view of transmission power modulation to facilitate in-device coexistence between wireless communication technologies in accordance with some example embodiments.

FIG. 2 illustrates an example time domain view of transmission power modulation to facilitate in-device coexistence between wireless communication technologies in accordance with some example embodiments. In this regard, FIG. 2 illustrates an example application of some example embodiments to the example scenario illustrated in FIG. 1. As illustrated in FIG. 2, a threshold level 202 is defined that is less than the full transmission power of the aggressor technology. The threshold level 202 can be any transmission power level at which aggressor transmissions do not inhibit concurrent data reception via the victim technology, but that is still sufficient to support successful transmission via the aggressor technology.

The transmission power of the aggressor transmission 204 can be reduced to the threshold level 202 prior to time $t_1$ when the reception 206 via the victim technology is scheduled to begin. It will be appreciated that the illustration in FIG. 2 is provided by way of example, and not by way of limitation. In this regard, there is no limit to how far in advance of $t_1$ that the transmission power is reduced to the threshold level 202 or the rate at which the transmission power is reduced. Accordingly, it will be appreciated that the rate and timing of power modulation can vary in different implementations so long as the transmission power is reduced to the threshold level 202 in advance of $t_1$.

The transmission power of the aggressor transmission 204 can be controlled during the reception 206 such that it does not exceed the threshold level 202. In this regard, the transmission power during the reception 206 can, for example, be controlled such that the transmission power remains substantially constant at threshold level 202. Alternatively, the transmission power can vary during the reception 206, but can be constrained so that it does not exceed threshold level. As the transmission 204 concludes prior to time $t_1$ when the reception 206 concludes, the transmission power of the aggressor transmission 204 can be controlled to not exceed the threshold level 202 from prior to time $t_1$ until conclusion of the aggressor transmission 204.

As the aggressor transmission 208 coincides with the data reception 210, the transmission power of the transmission 208 can be reduced to the threshold level 202 prior to time $t_3$ when the reception 210 via the victim technology is scheduled to begin. The transmission power of the aggressor transmission 204 can be controlled during the reception 210 such that it does not exceed the threshold level 202. As the aggressor transmission 208 continues following time $t_4$ when the reception 210 concludes, the transmission power of the transmission 208 can be increased to a level exceeding the threshold level 202 following $t_4$. The transmission power can, for example, be increased to the same level as was used prior to the transmission power being reduced in advance of $t_3$. However, it will be appreciated that in instances in which the transmission power of a transmission 208 is increased subsequent to $t_3$, it can be increased to any level, including a level different from that used prior to the transmission power being reduced in advance of $t_3$. It will be further appreciated that at the illustration in FIG. 2 is provided by way of example, and not by way of limitation. As such, it will be noted that the timing and rate of the increase in transmission power following $t_4$ can vary in different implementations.

Aggressor transmission 212 does not coincide with a victim technology reception period. As such, a transmission power exceeding threshold level 202 can be used for the duration of aggressor transmission 212.

Figure 3:
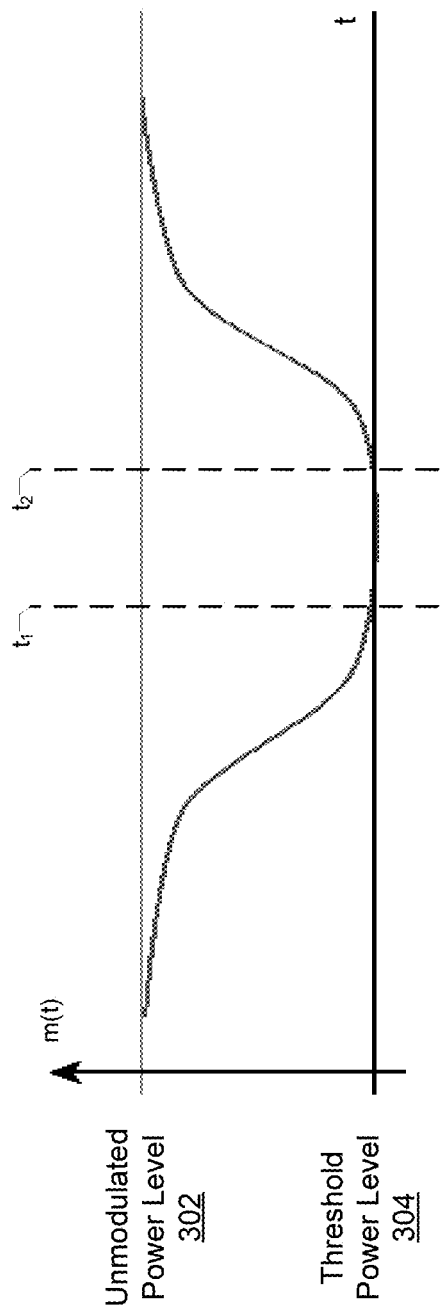
FIG. 3 illustrates an example transmission power waveform in accordance with some example embodiments.

FIG. 3 illustrates an example transmission power waveform in accordance with some example embodiments. In this regard, FIG. 3 illustrates an example modulation of transmission power of an aggressor transmission in response to an overlapping reception period for a victim technology in accordance with some example embodiments. For example, the transmission power waveform of FIG. 3 can be applied to the transmission power of aggressor transmission 208 illustrated in FIG. 2.

As illustrated in FIG. 3, the transmission power can be reduced from an unmodulated power level 302 to a threshold power level 304 in advance of time $t_1$, which can coincide with the start of a reception period for a victim technology. It will be appreciated that the illustration in FIG. 3 is provided by way of example, and not by way of limitation. In this regard, there is no limit to how far in advance of $t_1$ that the transmission power is reduced to the threshold power level 304 or the rate at which the transmission power is reduced. Accordingly, it will be appreciated that the rate and timing of power modulation can vary in different implementations so long as the transmission power is reduced to the threshold level 304 in advance of $t_1$. After reduction to the threshold power level 304, the transmission power can be controlled such that it does not exceed the threshold power level 304 until after time $t_2$, which can coincide with the conclusion of the reception period for the victim technology. After $t_2$, the transmission power can be increased to a level exceeding the threshold power level 304, and can, for example, be returned to the unmodulated power level 302. It will be appreciated that the timing, rate, and level of transmission power increase illustrated in FIG. 3 following $t_2$ is illustrated by way of example, and not by way of limitation.

Some example embodiments provide for increasing power amplifier linearity in addition to or in alternative to transmission power modulation in order to facilitate in-device coexistence between wireless communication technologies. In this regard, such example embodiments provide for adjusting an operational parameter of a power amplifier applied to a transmission emitted via an aggressor technology to increase a linearity of the power amplifier during a scheduled time period in which data is received by a victim technology. For example, some such example embodiments provide for adjusting a bias current applied to the power amplifier in order to increase linearity. By increasing linearity of a power amplifier during a victim technology reception period, victim technology desense that can be caused by OOB interference and harmonics interference can be prevented.

Figure 4:
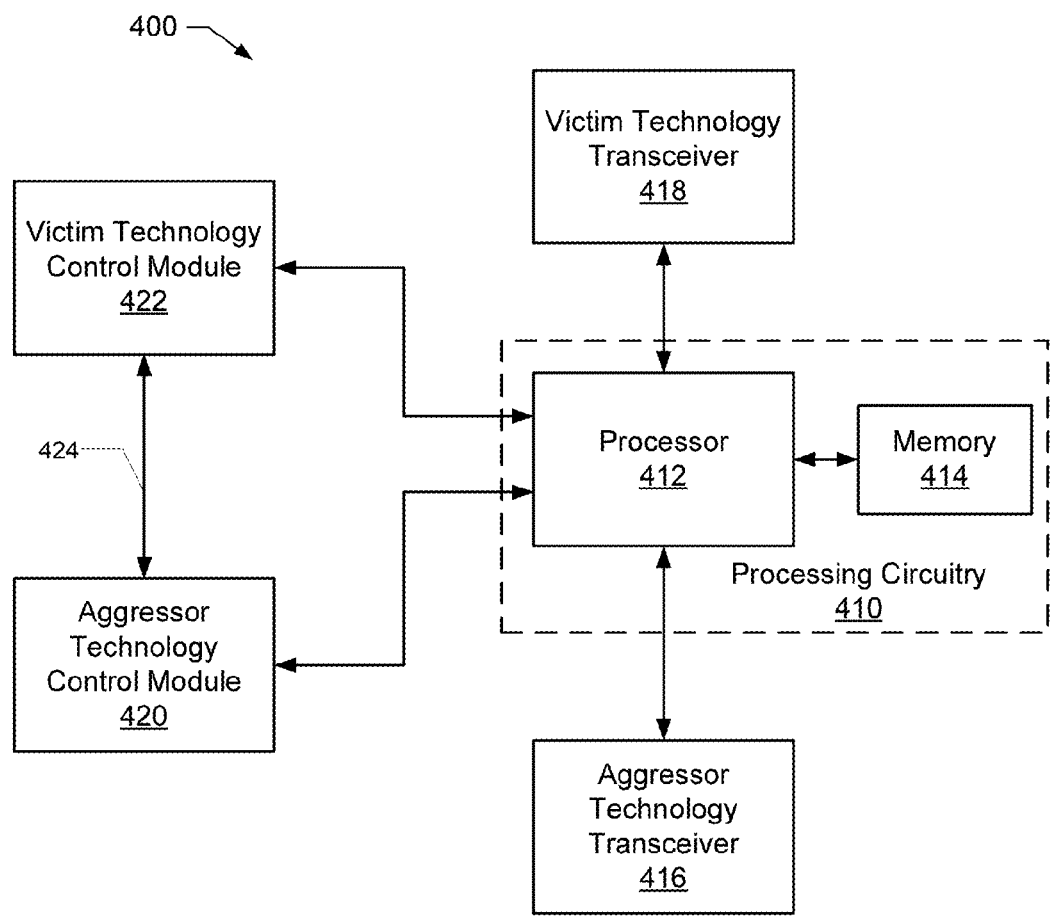
FIG. 4 illustrates a block diagram of a mobile communication device in accordance with some example embodiments.

Having now introduced aspects of various embodiments, several embodiments will now be described in more detail. Referring now to FIG. 4, FIG. 4 illustrates a block diagram of a mobile communication device 400 in accordance with some example embodiments. The mobile communication device 400 can be any device capable of communicating via multiple wireless communication technologies. By way of non-limiting example, the mobile communication device 400 can be a mobile phone, tablet computing device, laptop computer, or other computing device adapted to communicate via multiple wireless communication technologies. It will be appreciated that the components, devices or elements illustrated in and described with respect to FIG. 4 below may not be mandatory and thus some may be omitted in certain embodiments. Additionally, some embodiments can include further or different components, devices or elements beyond those illustrated in and described with respect to FIG. 4.

In some example embodiments, the mobile communication device 400 can include processing circuitry 410 that is configurable to perform actions in accordance with one or more example embodiments disclosed herein. In this regard, the processing circuitry 410 can be configured to perform and/or control performance of one or more functionalities of the mobile communication device 400 in accordance with various example embodiments, and thus can provide means for performing functionalities of the mobile communication device 400 in accordance with various example embodiments. The processing circuitry 410 may be configured to perform data processing, application execution and/or other processing and management services according to one or more example embodiments. In some embodiments, the mobile communication device 400 or a portion(s) or component(s) thereof, such as the processing circuitry 410, can include one or more chips, or one or more chipsets. The processing circuitry 410 and/or one or more further components of the mobile communication device 400 can therefore, in some instances, be configured to implement an embodiment on a single chip or chipset.

In some example embodiments, the processing circuitry 410 can include a processor 412 and, in some embodiments, such as that illustrated in FIG. 2, can further include memory 414. The processing circuitry 410 can be in communication with or otherwise control an aggressor technology transceiver 416, victim technology transceiver 418, aggressor technology control module 420, and/or victim technology control module 422.

The processor 412 can be embodied in a variety of forms. For example, the processor 412 can be embodied as various processing means such as a microprocessor, a coprocessor, a controller or various other computing or processing devices including integrated circuits such as, for example, an ASIC (application specific integrated circuit), an FPGA (field programmable gate array), some combination thereof; or the like. Although illustrated as a single processor, it will be appreciated that the processor 412 can comprise a plurality of processors. The plurality of processors can be in operative communication with each other and can be collectively configured to perform one or more functionalities of the mobile communication device 400 as described herein. In some example embodiments, the processor 412 can be configured to execute instructions that can be stored in the memory 414 or that can be otherwise accessible to the processor 412. As such, whether configured by hardware or by a combination of hardware and software, the processor 412 capable of performing operations according to various embodiments while configured accordingly.

In some example embodiments, the memory 414 can include one or more memory devices. Memory 414 can include fixed and/or removable memory devices. In some embodiments, the memory 414 can provide a non-transitory computer-readable storage medium that can store computer program instructions that can be executed by the processor 412. In this regard, the memory 414 can be configured to store information, data, applications, instructions and/or the like for enabling the mobile communication device 400 to carry out various functions in accordance with one or more example embodiments. In some embodiments, the memory 414 can be in communication with one or more of the processor 412, aggressor technology transceiver 416, victim technology transceiver 418, aggressor technology control module 420, or victim technology control module 422 via a bus(es) for passing information among components of the mobile communication device 400.

The mobile communication device 400 can further include a plurality of transceivers. Each such transceiver can be configured to enable the mobile communication device 400 to communicate via a particular wireless communication technology. In the example of FIG. 4, an aggressor technology transceiver 416 and victim technology transceiver 418 are illustrated. The aggressor technology transceiver 416 and victim technology transceiver 418 can each support any wireless communication technology. Transmissions via an aggressor technology supported by the aggressor technology transceiver 416 at a power level exceeding a threshold level defined in accordance with various embodiments that overlap with data reception via a victim technology supported by the victim technology transceiver 418 can impact the data reception via the victim technology. In some example embodiments, the aggressor technology transceiver 416 can be a cellular transceiver. For example, the aggressor technology transceiver 416 can be configured to support communication via a Long Term Evolution (LTE) cellular communication technology, a Universal Mobile Telecommunications System (UMTS) cellular communication technology, a Global System for Mobile Communications (GSM) cellular communication technology, a Code Division Multiple Access (CDMA) cellular communication technology, or a CDMA 2000 cellular communication technology, and/or the like. In some example embodiments, the victim technology transceiver can be a transceiver supporting a communications technology using an ISM band, such as Bluetooth, Zigbee, or other wireless personal area network (PAN) technology; Wi-Fi or other wireless local area network (LAN) communication technology; or other wireless communication technology using an ISM band. It will be appreciated, however, that embodiments are not limited to facilitating cellular and ISM band coexistence, as some embodiments can facilitate in-device coexistence between any two disparate wireless communication technologies. For example, in some embodiments, the aggressor technology transceiver 416 can support a first cellular communication technology and the victim technology transceiver 418 can support a second cellular communication technology. As a further alternative example, in some embodiments, the aggressor technology transceiver 416 can support a first wireless communication technology using an ISM band and the victim technology transceiver 416 can support a second wireless communication technology using an ISM band.

The mobile communication device 400 can further include aggressor technology control module 420, which can be configured to interface with and/or otherwise control operation of the aggressor technology transceiver 416. The aggressor technology control module 420 can be embodied as various means, such as circuitry, hardware, a computer program product comprising computer readable program instructions stored on a computer readable medium (for example, the memory 414) and executed by a processing device (for example, the processor 412), or some combination thereof. In some embodiments, the processor 412 (or the processing circuitry 410) can include, or otherwise control the aggressor technology control module 420.

The mobile communication device 400 can additionally include victim technology control module 422, which can be configured to interface with and/or otherwise control operation of the victim technology transceiver 418. The victim technology control module 422 can be embodied as various means, such as circuitry, hardware, a computer program product comprising computer readable program instructions stored on a computer readable medium (for example, the memory 414) and executed by a processing device (for example, the processor 412), or some combination thereof. In some embodiments, the processor 412 (or the processing circuitry 410) can include, or otherwise control the victim technology control module 422.

In some example embodiments, the aggressor technology control module 420 and victim technology control module 422 can be configured to communicate with each other via an interface 424. In this regard, the interface 424 can enable the victim technology control module 422 to send a message to the aggressor technology control module that can include an indication of a scheduled time period during which data is received by the victim technology transceiver 418 so that the aggressor technology control module 420 can reduce a transmission power of a transmission via the aggressor technology transceiver 416 and/or increase a linearity of a power amplifier(s) applied to the transmission such that the transmission does not inhibit data reception by the victim technology transceiver 418. In some example embodiments, the interface 424 can be a direct interface between the aggressor technology control module 420 and victim technology control module 422. However, it will be appreciated that embodiments are not so limited. In this regard, the interface 424 can be an interface having a route through one or ore other modules or components of the mobile communication device 400 (potentially including one or more modules or components that are not illustrated in FIG. 4). For example, the interface 424 can interface the aggressor technology control module 420 and victim technology control module 422 indirectly via the processing circuitry 410. In some example embodiments in which the victim technology is Bluetooth, the interface 424 can be implemented as a Wireless Coexistence Interface 2 (WCI-2) interface, which can be extended in accordance with one or more embodiments to support a message from the victim technology control module 422 to the aggressor technology control module 420 including an indication of a time period during which data is received via the victim technology.

Figure 5:
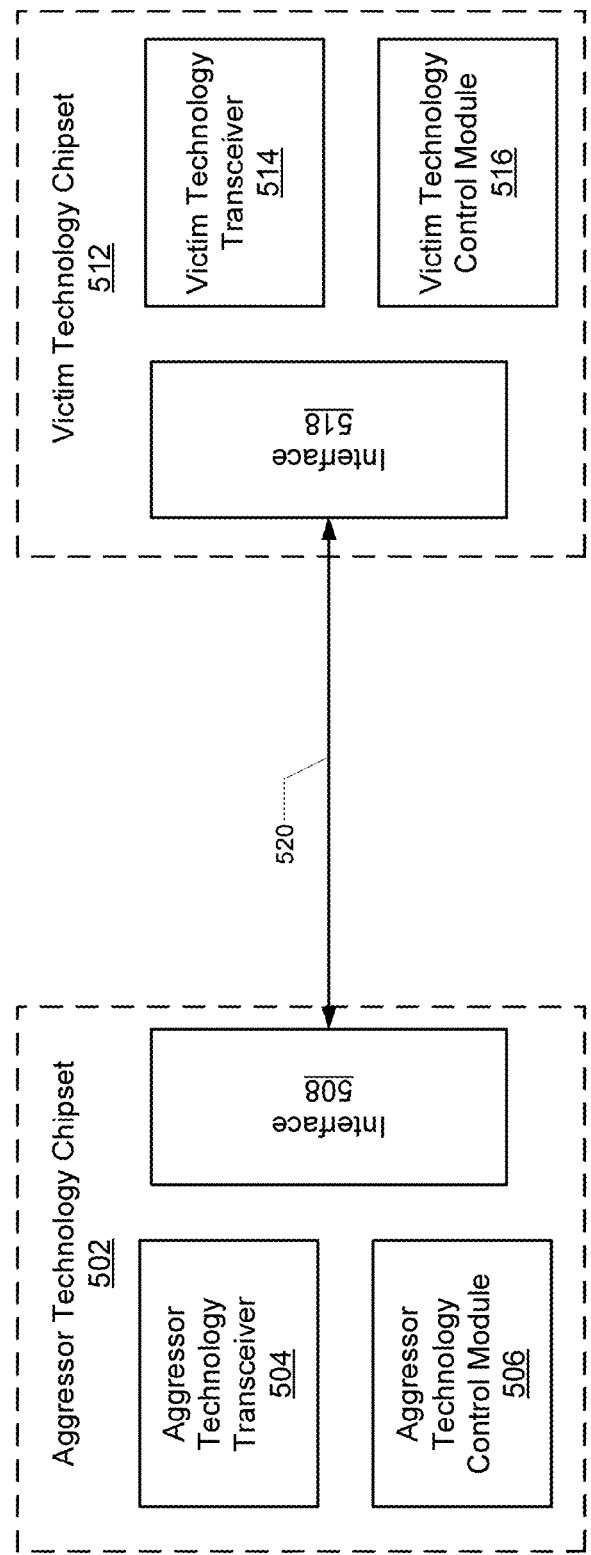
FIG. 5 illustrates interfaced chipsets configured to facilitate in-device coexistence between wireless communication technologies in accordance with some example embodiments.

As discussed, in some example embodiments, the components illustrated in FIG. 4 can form one or more chipsets. FIG. 5 illustrates interfaced chipsets configured to facilitate in-device coexistence between wireless communication technologies in accordance with some such example embodiments. In the example of FIG. 5, an aggressor technology chipset 502 can include aggressor technology transceiver 504, aggressor technology control module 506, and interface component 508. Aggressor technology transceiver 504 can, for example, be an embodiment of aggressor technology transceiver 416. Aggressor technology control module 506 can, for example, be an embodiment of aggressor technology control module 420. The interface component 508 can enable coupling of the aggressor technology chipset 502 to the victim technology chipset 512 via interface 520 between the aggressor technology chipset 502 and the victim technology chipset 512. The interface 520 can, for example, be an embodiment of the interface 424. The aggressor technology chipset 502 can be a chipset configured to support communication via a particular wireless communication technology, which can be implemented on, or otherwise operably coupled to a computing device, such as the mobile communication device 400, to enable the computing device to engage in wireless communications via the wireless communication technology supported by the aggressor technology chipset 502. Thus, for example, in embodiments in which the aggressor technology chipset 502 comprises a cellular chipset, the aggressor technology chipset 502 can enable a device to engage in cellular communications when implemented on the device.

The victim technology chipset 512 can include victim technology transceiver 514, victim technology control module 516, and interface component 518. Victim technology transceiver 514 can, for example, be an embodiment of victim technology transceiver 418. Victim technology control module 516 can, for example, be an embodiment of victim technology control module 422. The interface component 518 can enable coupling of the victim technology chipset 512 to the aggressor technology chipset 502 via interface 520. The victim technology chipset 512 can be a chip set configured to support communication via a particular wireless communication technology, which can be implemented on, or otherwise operably coupled to a computing device, such as the mobile communication device 400, to enable the computing device to engage in wireless communications via the wireless communication technology supported by the victim technology chipset 512. Thus, for example, in embodiments in which the victim technology chipset 512 comprises a Bluetooth chipset, the aggressor technology chipset 512 can enable a device to engage in Bluetooth communications when implemented on the device.

It will be appreciated that embodiments other than those in separate chipsets are used for the aggressor technology and the victim technology are contemplated within the scope of the disclosure. For example, in some example embodiments, both the aggressor technology and the victim technology can be supported by the same chip or chipset. In such embodiments, the both the aggressor technology control module 420 and victim technology control module 422 can be co-located on a single chip or chipset. Thus, for example, some example embodiments can be implemented on a single chip or chipset configured to provide both cellular and Bluetooth communication functionality.

Figure 6:
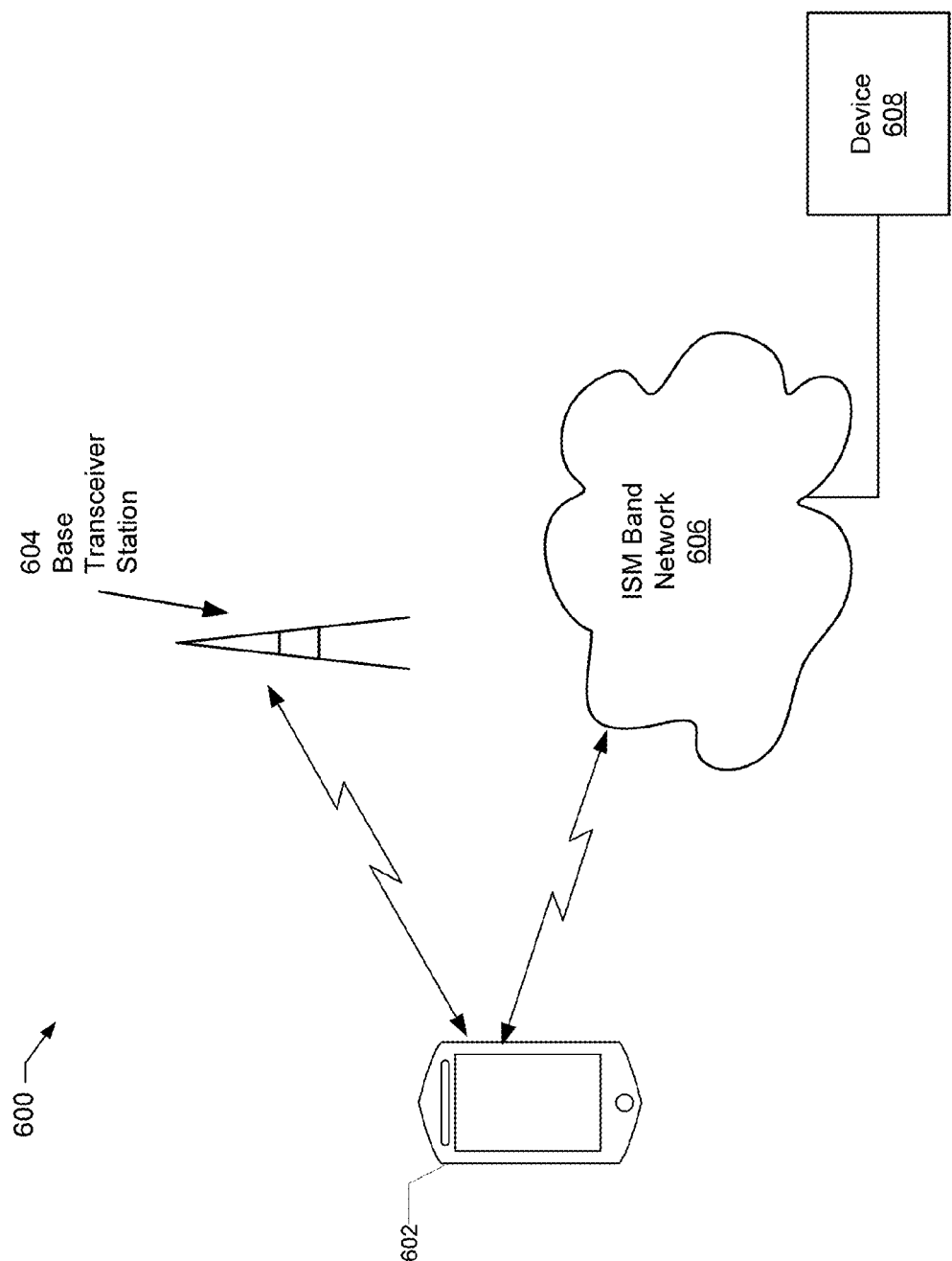
FIG. 6 illustrates an example system in which some example embodiments can be implemented to facilitate in-device coexistence between wireless communication technologies.

FIG. 6 illustrates an example system 600 in which some example embodiments can be implemented to facilitate in-device coexistence between wireless communication technologies. The system 600 can include a mobile communication device 602, which can, for example, be an embodiment of mobile communication device 602. In some example embodiments, the mobile communication device 602 can include aggressor technology chipset 502 and victim technology chipset 512. The mobile communication device 602 can be configured to engage in cellular communications, which can be supported by a base transceiver station 604. For example, the mobile communication device 602 can be configured to engage in communication via a Long Term Evolution (LTE) cellular communication technology, a Universal Mobile Telecommunications System (UMTS) cellular communication technology, a Global System for Mobile Communications (GSM) cellular communication technology, a Code Division Multiple Access (CDMA) cellular communication technology, or a CDMA 2000 cellular communication technology, and/or other cellular communication technology. The mobile communication device 602 can be further configured to engage in communications via an ISM band technology. Thus, for example, the mobile communication device 602 can engage in wireless communications with a device 608 via an ISM band network 606. For example, in embodiments in which the ISM band network 606 is a Bluetooth network, the device 608 can be a Bluetooth headset or other Bluetooth device that can be interfaced with a mobile communication device.

In context of the system 600, various embodiments, including at least some of those described further herein below can be implemented on the mobile communication device 602 to control the transmission power of cellular transmissions sent by the mobile communication device 602 to the base transceiver station 604 during periods in which the mobile communication device 602 is scheduled to receive data sent by the device 608 via the ISM band network 606 so that data receipt via the ISM band technology is not impacted by the cellular transmissions. Additionally or alternatively, at least some embodiments described herein below can be implemented on the mobile communication device 602 to increase linearity of a power amplifier(s) applied to a cellular transmission sent by the mobile communication device 602 to the base transceiver station 604 during periods in which the mobile communication device 602 is scheduled to receive data sent by the device 608 via the ISM band network 606 so that data receipt via the ISM band technology is not impacted by the cellular transmissions. It will be appreciated, however, that system 600 is provided merely by way of example. In this regard, as previously noted, some example embodiments facilitate in-device wireless communication technology coexistence scenarios other than cellular and ISM band coexistence.

Having now described example devices and components that can implement various embodiments disclosed herein and an example system in which some example embodiments can be implemented, several example embodiments will be described in additional detail with reference to the components described in FIGS. 4 and 5. Further, some example embodiments will be described by way of example with respect to the system 600 illustrated in FIG. 6.

The victim technology control module 422 of some example embodiments can be configured to determine one or more scheduled time periods during which data is received via the victim technology and for which action should be taken to reduce interference from transmissions via the aggressor technology. In this regard, for example, the victim technology control module 422 of some such example embodiments can be configured to determine one or more scheduled time periods during which data is received via the victim technology and for which a transmission power associated with a transmission via the aggressor technology should be reduced. Additionally or alternatively, the victim technology control module 422 of some such example embodiments can be configured to determine one or more scheduled time periods during which data is received via the victim technology and for which linearity of a power amplifier(s) that can be applied to a transmission via the aggressor technology should be increased. The scheduled time periods can be dedicated time slots or other periods during which data is scheduled to be received via the victim technology. The scheduled time periods can, for example, be negotiated between the mobile communication device 400 and another device with which the mobile communication device 400 can be communicating via the victim technology, such as by way of non-limiting example, the device 608. In some embodiments, communication via the victim technology can include communication over a synchronous connection using synchronized scheduled time slots. For example, in embodiments in which the victim technology is Bluetooth, communication can be over a synchronous connection oriented (SCO) link or an enhanced SCO (eSCO) link having a set of reserved timeslots scheduled for data reception. Accordingly, the victim technology control module 422 can be configured to determine a scheduled time slot during which data is received via the victim technology based on a known schedule that can be established upon link setup, negotiated with another device, and/or the like.

The victim technology control module 422 can be further configured to format a message including an indication of a scheduled time period(s) during which data is received via the victim technology. In this regard, the message can indicate a period(s) for which a transmission power associated with a transmission via the aggressor technology should be reduced and/or for which a linearity of a power amplifier(s) that can be applied to a transmission via the aggressor technology should be increased. The indication of a scheduled time period can be any information that can enable the aggressor technology control module 420 to identify a starting time and an ending time of a victim technology reception period. By way of non-limiting example, the indication can include a start time, an offset from a present time indicating when a reception period is to begin, an end time of the reception period, a duration of a reception period, a time slot identifier, and/or other information to enable the aggressor technology control module 420 to identify a time period indicated in the message. The victim technology control module 422 can be further configured to send the message to the aggressor technology control module 420 via the interface 424. In this regard, the message can be sent to request that the aggressor technology control module 420 reduce the transmission power to the threshold level prior to the scheduled time period(s) and control the transmission power so that it does not exceed the threshold level during the scheduled time period(s). Additionally or alternatively, the message can be sent to request that the aggressor technology control module 422 increase a linearity of a power amplifier(s) that can be applied to an aggressor technology transmission during the scheduled time period(s)

In some example embodiments, a message may only contain an indication of a single scheduled time period. In this regard, in such example embodiments, a message can, for example, be formatted and sent by the victim technology control module 422 in advance of each scheduled time period for which the aggressor technology transmission power needs to be reduced and/or for which power amplifier linearity needs to be increased. Additionally or alternatively, in some example embodiments, the victim technology control module 422 can format and send a message including an indication of a plurality of scheduled time periods for which the aggressor technology transmission power needs to be reduced and/or for which power amplifier linearity needs to be increased. In this regard, the victim technology control module 422 may be aware in advance of a plurality of scheduled time periods during which data is received and for which the aggressor technology transmission power needs to be reduced and/or for which power amplifier linearity needs to be increased, and can format and send a single message to the aggressor technology control module 420 that indicates each of the plurality of scheduled time periods. Accordingly, processing and signaling overhead can be reduced in such embodiments by using a single message to notify the aggressor technology control module 420 of multiple scheduled time periods. As an example, in some instances, a schedule can be negotiated or assigned during setup of a communication link using the victim technology. In such instances, the victim technology control module 422 can send a message notifying the aggressor technology control module 420 of known scheduled time periods during which data is received via the victim technology and for which the victim technology transmission power should be reduced and/or for which power amplifier linearity should be increased during or following setup of the victim technology communication link on the basis of the known schedule.

The aggressor technology control module 420 can be configured to receive a message sent by the victim technology control module 422 via the interface 424. The aggressor technology control module 420 can be further configured to determine a scheduled time period(s) during which data is received via the victim technology on the basis of indication(s) included in a received message. In response to the message, the aggressor technology control module 420 can reduce the transmission power of an aggressor technology transmission that may be emitted by the aggressor technology transceiver to a threshold level prior to a scheduled time period indicated in the message and control the transmission power during the scheduled time period so that the transmission power does not exceed the threshold level. If transmission via the aggressor technology is still ongoing following conclusion of the scheduled time period, the aggressor technology control module 420 can be further configured to increase the transmission power to a level exceeding the threshold level subsequent to the scheduled time period.

The reduction and control of the transmission power to enable receipt of data via the victim technology during a scheduled time period can, for example, be performed in a manner similar to that illustrated in and described with respect to FIGS. 2 and 3. In some example embodiments, such as that illustrated in FIG. 6 in which the aggressor technology is a cellular technology, the reduction and control of the transmission power can, for example, take into account a power control loop configuration of the base transceiver station 604.

The threshold level to which transmission power is reduced can be implementation specific on the basis of the implementation of the mobile communication device 400. In this regard, the threshold level may vary on the basis of filters that may be used for the victim technology and/or for the aggressor technology, a proximity and arrangement of the aggressor technology transceiver 416 and victim technology transceiver 418. In some example embodiments, the threshold level can vary on the basis of actual channel conditions, such as particular channel assignments, packet types, use profile, use case etc, and/or the like. Accordingly, variety of factors can be considered in order to determine the threshold level that is appropriate to a particular device implementation and channel scenario. In some example embodiments, such as those in which the threshold level is dependent solely upon channel implementation, the threshold level can be set and provisioned by a device manufacturer, network service provider, or the like. In embodiments in which a threshold level can vary on the basis of channel conditions, the aggressor technology control module and/or victim technology control module 422 can be configured to calculate the threshold level on the basis of existing channel conditions. Such calculation can additionally take into account a design implementation of the mobile communication device 400, such as filters that may be used for the victim technology and/or for the aggressor technology, a proximity and arrangement of the aggressor technology transceiver 416 and victim technology transceiver 418, and/or other deign factors that can influence the threshold level.

As such, it will be appreciated that the actual threshold level can vary with implementation and, in some embodiments, can vary on the basis of experienced channel conditions, link configuration, and/or the like. However, regardless of the particular implementation, the threshold level can be a power level at which transmission via the aggressor technology does not inhibit concurrent data reception via the victim technology.

The aggressor technology control module 420 can be configured to use any of a variety of methods to control the transmission power. By way of example, in some embodiments, a lookup table may store one or more transmission power curves specifying a power modulation curve for a particular time period duration. The aggressor technology control module 420 can accordingly be configured in such embodiments to look up an appropriate modulation curve for a given time period during which data is received via the victim technology and can apply the modulation curve. Additionally or alternatively, in some example embodiments, a low pass filter can be used to reduce the transmission power. As a further example, in some embodiments, the aggressor technology control module 420 can use a series of commands to step down transmission power and, if transmission power is increased subsequent to conclusion of a victim reception time period, to step up the transmission power. As yet another example, the aggressor technology control module 420 of some embodiments can be configured to utilize a response time of a digitally controlled power supply to control the transmission power.

In some example embodiments, transmission power of the aggressor technology can be reduced each time period during which data is received via the victim technology. Alternatively, in some example embodiments, transmission power can be selectively reduced such that transmission power is not reduced for each reception period during which data is received via the victim technology. In such embodiments, the victim technology control module 422 can selectively determine for a scheduled time period in which data is received via the victim technology whether the transmission power should be reduced. If the victim technology control module 422 determines that transmission power should not be reduced for the scheduled time period, the victim technology control module 422 can determine to not send a message to the aggressor technology control module 420 that includes an indication of the scheduled time period.

As an example of selective reduction of transmission power for a subset of scheduled time periods in which data is received via the victim technology, the victim technology control module 422 can be configured in some example embodiments to determine whether data to be received satisfies a threshold priority criterion. If the data received in a particular time period does not satisfy the threshold priority criterion, then the victim technology control module 422 can determine that the transmission power should not be reduced for that time period. For example, in some example embodiments, control messages, such as messages relating to connection configuration or link management, can be prioritized over other non-control messages. Accordingly, in such embodiments, if the victim technology control module 422 determines that a control message is received in a time period, the victim technology control module 422 can determine that transmission power of the aggressor technology should be reduced for that time period. However, if data received in a time period is a non-control message (e.g., a simple data message), the victim technology control module 422 may determine that the non-control message does not satisfy a threshold priority criterion and that transmission power of the aggressor technology should not be reduced for that time period. Control messages can, for example, provide for connection control, including, by way of non-limiting example, connection establishment, connection detachment, time slot configuration, power control, adaptive frequency hopping, channel quality driven data rate change (CQDDR), quality of service control, data rate control, role switching, and/or the like. As a further example, control messages can provide for security measures, such as, by way of non-limiting example, authentication, pairing, link key establishment, encryption configuration, and/or the like. In embodiments in which the victim technology is Bluetooth, a control message can include Link Manger Protocol (LMP) messages. If an LMP message is received in a time period, then transmission power of an aggressor technology transmission can be reduced. However, transmission power may not be reduced for reception of data other than LMP messages.

Figure 7:
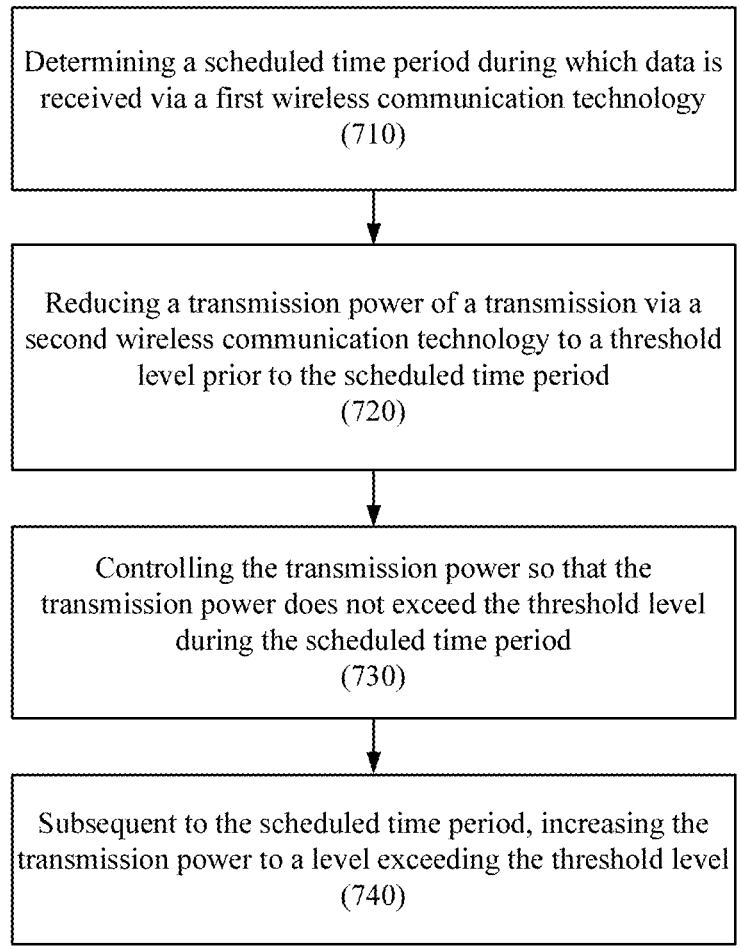
FIG. 7 illustrates a flowchart according to an example method for performing transmission power modulation to facilitate in-device coexistence between wireless communication technologies according to some example embodiments.

FIG. 7 illustrates a flowchart according to an example method for performing transmission power modulation to facilitate in-device coexistence between wireless communication technologies according to some example embodiments. Operation 710 can include determining a scheduled time period during which data is received via a first wireless communication technology. One or more of processing circuitry 410, processor 412, memory 414, aggressor technology control module 420, victim technology control module 422, aggressor technology chipset 502, and victim technology chipset 512 can, for example, provide means for performing operation 710. Operation 720 can include reducing a transmission power of a transmission via a second wireless communication technology to a threshold level prior to the scheduled time period. Operation 730 can include controlling the transmission power during the scheduled time period so that the transmission power does not exceed the threshold level. Operation 740 can include, subsequent to the scheduled time period, increasing the transmission power to a level exceeding the threshold level. One or more of processing circuitry 410, processor 412, memory 414, aggressor technology transceiver 416, aggressor technology control module 420, and aggressor technology chipset 502 can, for example, provide means for performing operations 720-740.

Figure 8:
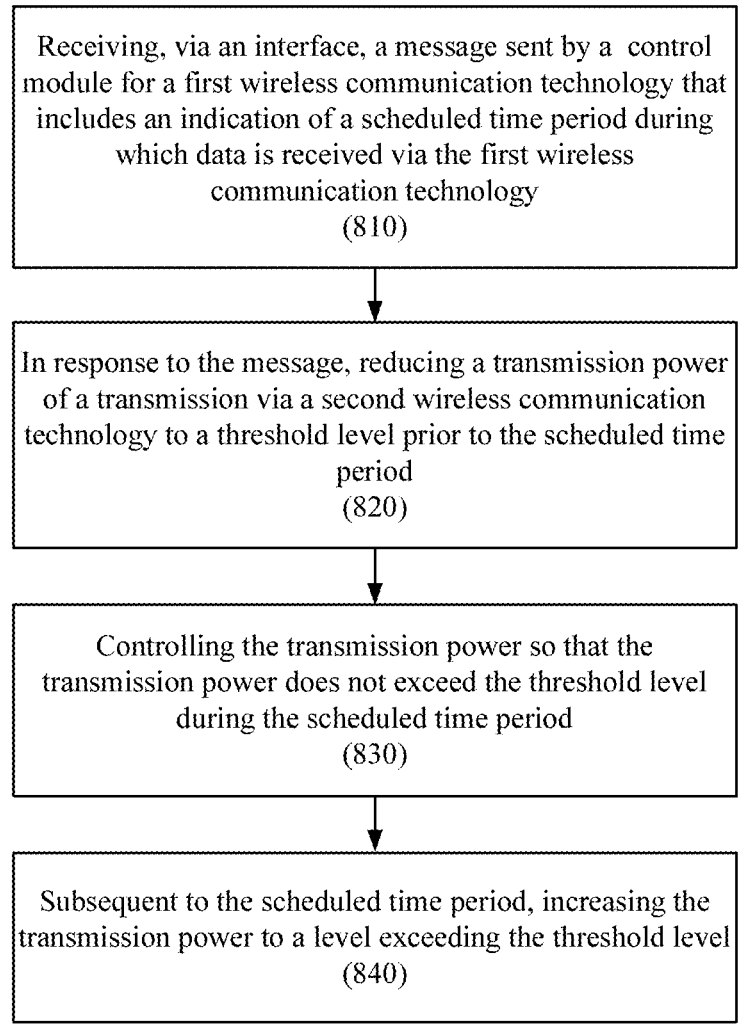
FIG. 8 illustrates a flowchart according to another example method for performing transmission power modulation to facilitate in-device coexistence between wireless communication technologies according to some example embodiments.

FIG. 8 illustrates a flowchart according to another example method for performing transmission power modulation to facilitate in-device coexistence between wireless communication technologies according to some example embodiments. Operation 810 can include receiving, via an interface (e.g., interface 424), a message sent by a control module for a first wireless communication technology that includes an indication of a scheduled time period during which data is received via the first wireless communication technology. One or more of processing circuitry 410, processor 412, memory 414, aggressor technology control module 420, and aggressor technology chipset 502 can, for example, provide means for performing operation 810. Operation 820 can include, in response to the message, reducing a transmission power of a transmission via a second wireless communication technology to a threshold level prior to the scheduled time period. Operation 830 can include controlling the transmission power during the scheduled time period so that the transmission power does not exceed the threshold level. Operation 840 can include, subsequent to the scheduled time period, increasing the transmission power to a level exceeding the threshold level. One or more of processing circuitry 410, processor 412, memory 414, aggressor technology transceiver 416, aggressor technology control module 420, and aggressor technology chipset 502 can, for example, provide means for performing operations 820-840.

Figure 9:
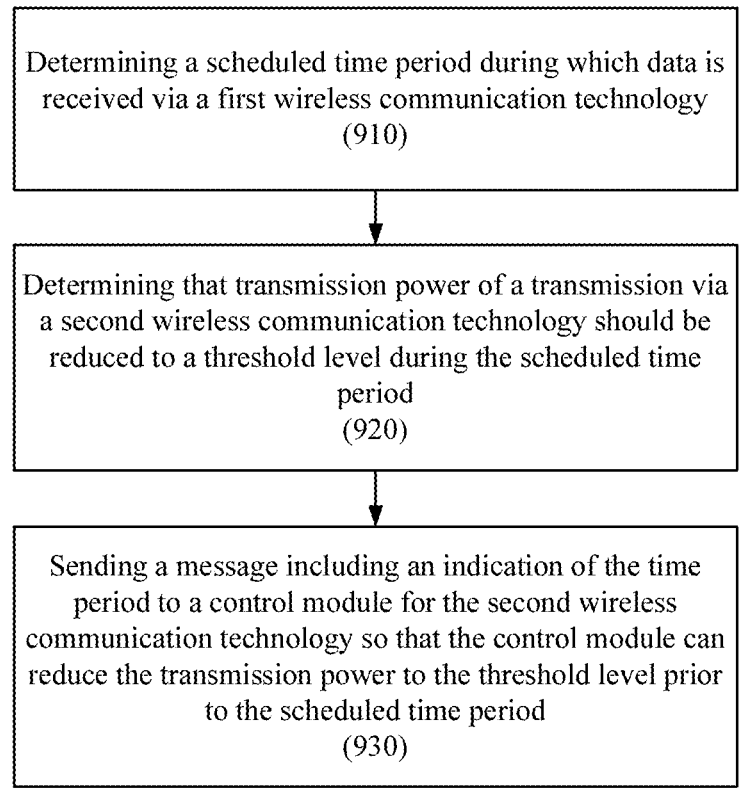
FIG. 9 illustrates a flowchart according to an example method for enabling performance of transmission power modulation to facilitate in-device coexistence between wireless communication technologies according to some example embodiments.

FIG. 9 illustrates a flowchart according to an example method for enabling performance of transmission power modulation to facilitate in-device coexistence between wireless communication technologies according to some example embodiments. Operation 910 can include determining a scheduled time period during which data is received via a first wireless communication technology. Operation 920 can include determining that transmission power of a transmission via a second wireless communication technology should be reduced to a threshold level during the scheduled time period. Operation 930 can include sending a message (e.g., via interface 424) including an indication of the time period to a control module for the second wireless communication technology (e.g., aggressor technology control module 420 or aggressor technology chipset 502) so that the control module can reduce the transmission power to the threshold level prior to the scheduled time period. One or more of processing circuitry 410, processor 412, memory 414, victim technology control module 422, and victim technology chipset 512 can, for example, provide means for performing operations 910-930.

Figure 10:
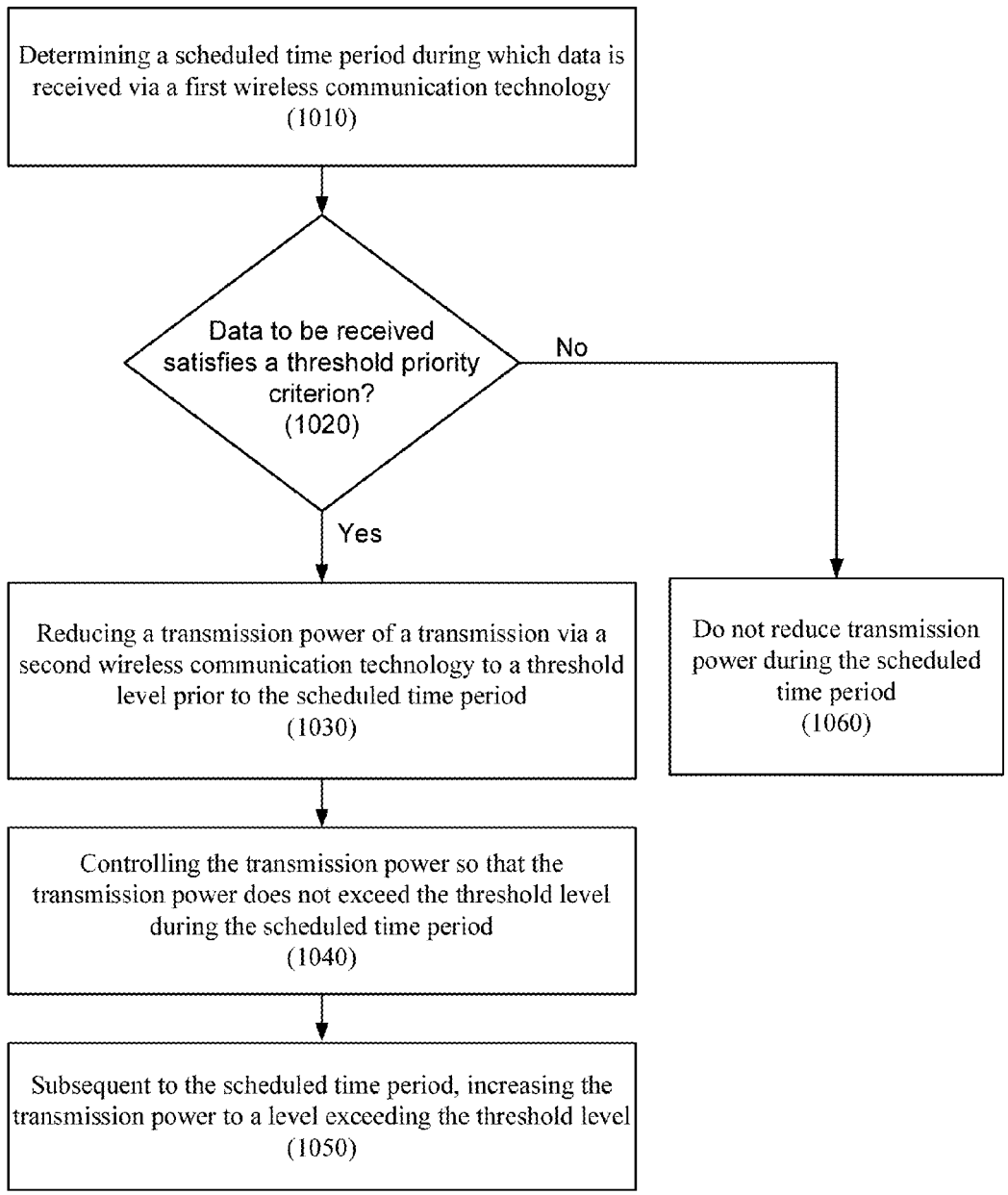
FIG. 10 illustrates a flowchart according to a further example method for performing transmission power modulation to facilitate in-device coexistence between wireless communication technologies according to some example embodiments.

FIG. 10 illustrates a flowchart according to a further example method for performing transmission power modulation to facilitate in-device coexistence between wireless communication technologies according to some example embodiments. Operation 1010 can include determining a scheduled time period during which data is received via a first wireless communication technology. Operation 1020 can include determining whether data to be received satisfies a threshold priority criterion. One or more of processing circuitry 410, processor 412, memory 414, victim technology control module 422, and victim technology chipset 512 can, for example, provide means for performing operations 1010-1020.

In an instance in which it is determined at operation 1020 that the data to be received does satisfy a threshold priority criterion, the method can further include one or more of operations 1030-1050. Operation 1030 can include reducing a transmission power of a transmission via a second wireless communication technology to a threshold level prior to the scheduled time period. Operation 1040 can include controlling the transmission power during the scheduled time period so that the transmission power does not exceed the threshold level. Operation 1050 can include, subsequent to the scheduled time period, increasing the transmission power to a level exceeding the threshold level. One or more of processing circuitry 410, processor 412, memory 414, aggressor technology transceiver 416, aggressor technology control module 420, and aggressor technology chipset 502 can, for example, provide means for performing operations 1030-1050.

If, however, it is determined at operation 1020 that the data to be received does not satisfy a threshold priority criterion, the method can further include operation 1060. Operation 1060 can include determining to not reduce transmission power during the scheduled time period. One or more of processing circuitry 410, processor 412, memory 414, victim technology control module 422, and victim technology chipset 512 can, for example, provide means for performing operation 1060.

In some example embodiments, the aggressor technology control module 420 can be configured to adjust an operational parameter of a power amplifier(s) applied to an aggressor technology transmission to increase a linearity of the power amplifier(s) during a scheduled time period indicated in a message sent by the victim technology control module 422. In such example embodiments, power amplifier linearity can be increased in addition to or in lieu of performance of transmission power modulation. Adjustment of the operational parameter of a power amplifier can, for example, include adjusting a bias current that can be applied to a power amplifier in order to increase the linearity of the power amplifier.

Figure 11:
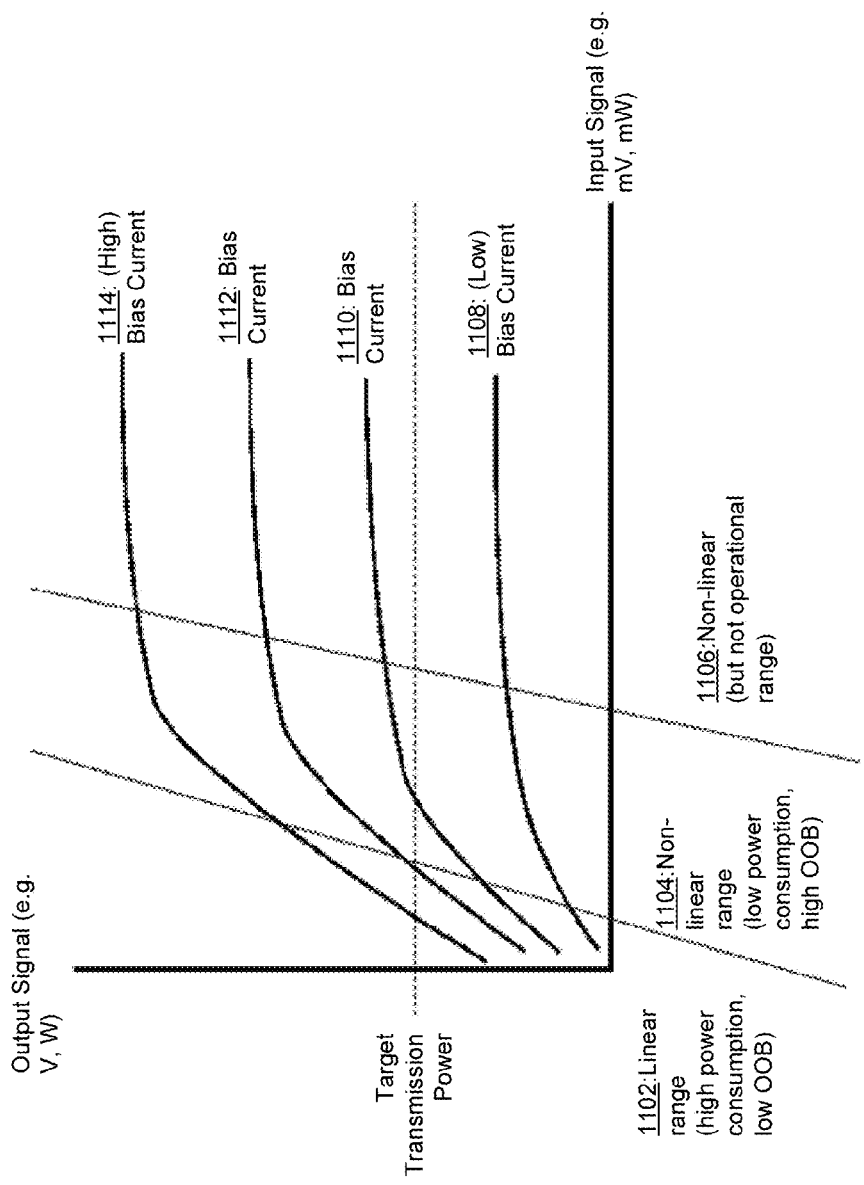
FIG. 11 illustrates examples of current biasing to achieve increased linearity of a power amplifier according to some example embodiments.

FIG. 11 illustrates examples of current biasing to achieve increased linearity of a power amplifier according to some example embodiments. In this regard, FIG. 11 illustrates a graph output signal versus input signal of an example power amplifier for four example bias currents ranging from a lowest relative bias current 1108 to a highest relative bias current 1114. For each given bias current, a power amplifier can operate in three given ranges 1102-1106. The range 1102 is a linear range in which a relatively low input signal is applied to the power amplifier. Power consumption in the range 1102 can be relatively high, but OOB interference to the victim technology can be relatively low. The range 1104 can be a non-linear range, which can offer relatively low power consumption, but at the expense of relatively high OOB interference to the victim technology. Range 1106 can be a non-operational range for the example power amplifier. Thus, power amplifier linearity can be increased with application of a higher bias current, but at the expense of greater power consumption.

During periods in which data is not being received via the victim technology in situations in which a target transmission power operating point is to be achieved, the example power amplifier of FIG. 11 can be operated so as to reduce power consumption. In this regard, a bias current as low as possible to meet the target transmission power operating point can be used. For example, the power amplifier can be operated in the range 1104 using the bias current 1110 during such periods.

In some example embodiments, bias current can be increased during a scheduled time period in which data is received via the victim technology to achieve increased power amplifier linearity. In this regard, an OOB emission mask and/or harmonic energy constraints can be met by reducing the bias current to increase power amplifier linearity. With reference to FIG. 11, a power amplifier can be operated in the range 1102 using the bias current 1112 or bias current 1114 during a scheduled period in which data is received via the victim technology, even at the expense of higher power consumption.

In some example embodiments, adjustment of a bias current can be performed in accordance with a power consumption constraint. Thus, for example, a bias current may not be increased to a highest level due to a power consumption constraint that can limit a bias current level to avoid excessive power consumption. As an example, the bias current 1112 can be used rather than the bias current 1114 even though greater linearity can be achieved using the bias current 1114 in situations in which usage of the bias current 1114 would exceed a power consumption constraint. In some such example embodiments, a power amplifier can also be operated to ensure that a regulatory emissions mask is met. Further, in some such example embodiments, a power amplifier can be operated to comply with constraints, such as OOB emissions constraints, that can be imposed by a regulatory body, such as the Federal Communications Commission (FCC).

In some example embodiments, multiple power amplifiers, such as a chain of power amplifiers can be applied to an aggressor technology transmission. In such example embodiments, an operational parameter of each of a plurality of power amplifiers can be adjusted to achieve increased linearity of multiple power amplifiers during a scheduled period in which data is received via the victim technology.

In some example embodiments, an operational parameter of a power amplifier can be adjusted from an initial state, such as a default state, at a point prior to a scheduled time period. Following the scheduled time period, the operational parameter can be returned to the initial state. Thus, using the example of FIG. 11, the bias current can be increased from the bias current 1110 to the bias current 1112 or bias current 1114 prior to, or at the start of, a scheduled time period in which data is received via the victim technology, and can be returned to the bias current 1110 at, or following, conclusion of the scheduled time period.

In some example embodiments, power amplifier linearity can be increased each time period during which data is received via the victim technology. Alternatively, in some example embodiments, power amplifier linearity can be selectively increased such that power amplifier linearity is not increased for each reception period during which data is received via the victim technology. In such embodiments, the victim technology control module 422 can selectively determine for a scheduled time period in which data is received via the victim technology whether the power amplifier linearity should be increased. If the victim technology control module 422 determines that power amplifier linearity should not be increased for the scheduled time period, the victim technology control module 422 can determine to not send a message to the aggressor technology control module 420 that includes an indication of the scheduled time period.

As an example of selective increase of power amplifier linearity for a subset of scheduled time periods in which data is received via the victim technology, the victim technology control module 422 can be configured in some example embodiments to determine whether data to be received satisfies a threshold priority criterion. If the data received in a particular time period does not satisfy the threshold priority criterion, then the victim technology control module 422 can determine that power amplifier linearity should not be increased for that time period. For example, in some example embodiments, control messages, such as messages relating to connection configuration or link management, can be prioritized over other non-control messages. Accordingly, in such embodiments, if the victim technology control module 422 determines that a control message is received in a time period, the victim technology control module 422 can determine that power amplifier linearity should be increased for that time period. However, if data received in a time period is a non-control message (e.g., a simple data message), the victim technology control module 422 may determine that the non-control message does not satisfy a threshold priority criterion and that power amplifier linearity should not be increased for that time period. Control messages can, for example, provide for connection control, including, by way of non-limiting example, connection establishment, connection detachment, time slot configuration, power control, adaptive frequency hopping, channel quality driven data rate change (CQDDR), quality of service control, data rate control, role switching, and/or the like. As a further example, control messages can provide for security measures, such as, by way of non-limiting example, authentication, pairing, link key establishment, encryption configuration, and/or the like. In embodiments in which the victim technology is Bluetooth, a control message can include Link Manger Protocol (LMP) messages. If an LMP message is received in a time period, then power amplifier linearity can be increased. However, power amplifier linearity may not be increased for reception of data other than LMP messages.

Figure 12:
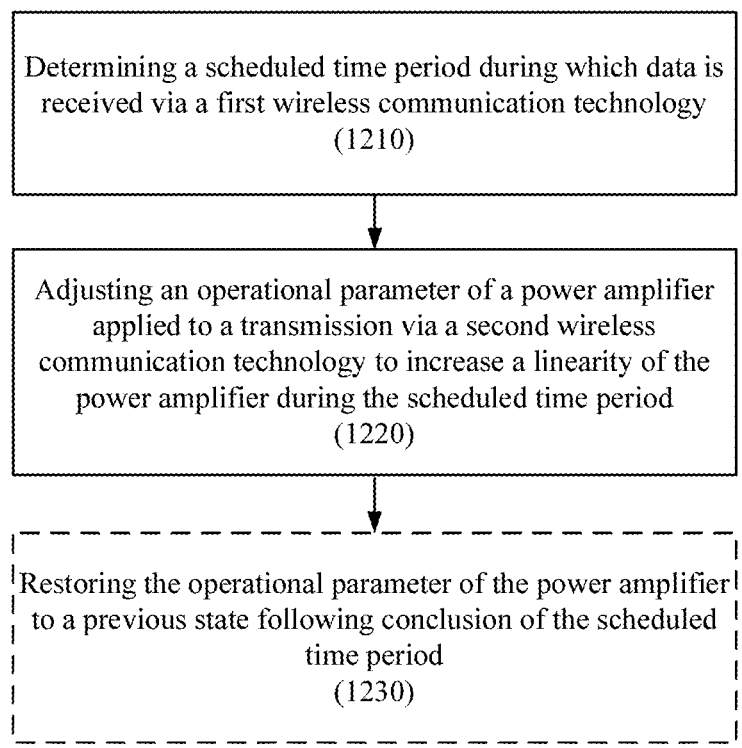
FIG. 12 illustrates a flowchart according to an example method for increasing linearity of a power amplifier to facilitate in-device coexistence between wireless communication technologies according to some example embodiments.

FIG. 12 illustrates a flowchart according to an example method for increasing linearity of a power amplifier to facilitate in-device coexistence between wireless communication technologies according to some example embodiments. Operation 1210 can include determining a scheduled time period during which data is received via a first wireless communication technology. One or more of processing circuitry 410, processor 412, memory 414, aggressor technology control module 420, victim technology control module 422, aggressor technology chipset 502, and victim technology chipset 512 can, for example, provide means for performing operation 1210. Operation 1220 can include adjusting an operational parameter of a power amplifier applied to a transmission via a second wireless communication technology to increase a linearity of the power amplifier during the scheduled time period. In some example embodiments, the method of FIG. 12 can further include operation 1230, which can include restoring the operational parameter of the power amplifier to a previous state following conclusion of the scheduled time period. In this regard, the operational parameter can be restored to an initial state, such as a default state, that was used prior to the adjustment of operation 1220. One or more of processing circuitry 410, processor 412, memory 414, aggressor technology control module 420, and aggressor technology chipset 502 can, for example, provide means for performing operations 1220-1230.

Figure 13:
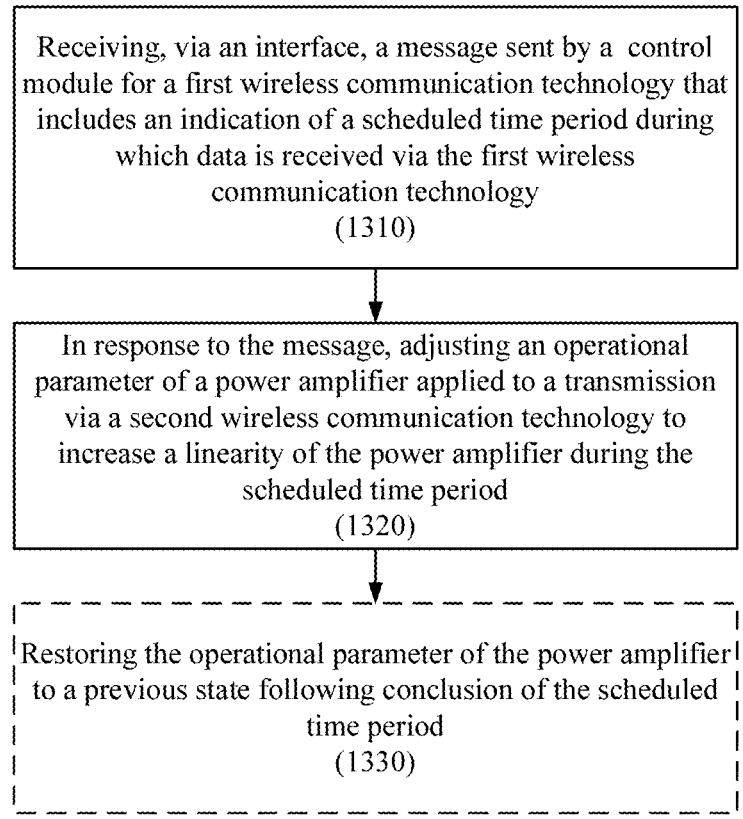
FIG. 13 illustrates a flowchart according to another example method for increasing linearity of a power amplifier to facilitate in-device coexistence between wireless communication technologies according to some example embodiments.

FIG. 13 illustrates a flowchart according to another example method for increasing linearity of a power amplifier to facilitate in-device coexistence between wireless communication technologies according to some example embodiments. Operation 1310 can include receiving, via an interface (e.g., interface 424), a message sent by a control module for a first wireless communication technology that includes an indication of a scheduled time period during which data is received via the first wireless communication technology. Operation 1320 can include, in response to the message, adjusting an operational parameter of a power amplifier applied to a transmission via a second wireless communication technology to increase a linearity of the power amplifier during the scheduled time period. In some example embodiments, the method of FIG. 13 can further include operation 1330, which can include restoring the operational parameter of the power amplifier to a previous state following conclusion of the scheduled time period. In this regard, the operational parameter can be restored to an initial state, such as a default state, that was used prior to the adjustment of operation 1320. One or more of processing circuitry 410, processor 412, memory 414, aggressor technology control module 420, and aggressor technology chipset 502 can, for example, provide means for performing operations 1310-1330.

Figure 14:
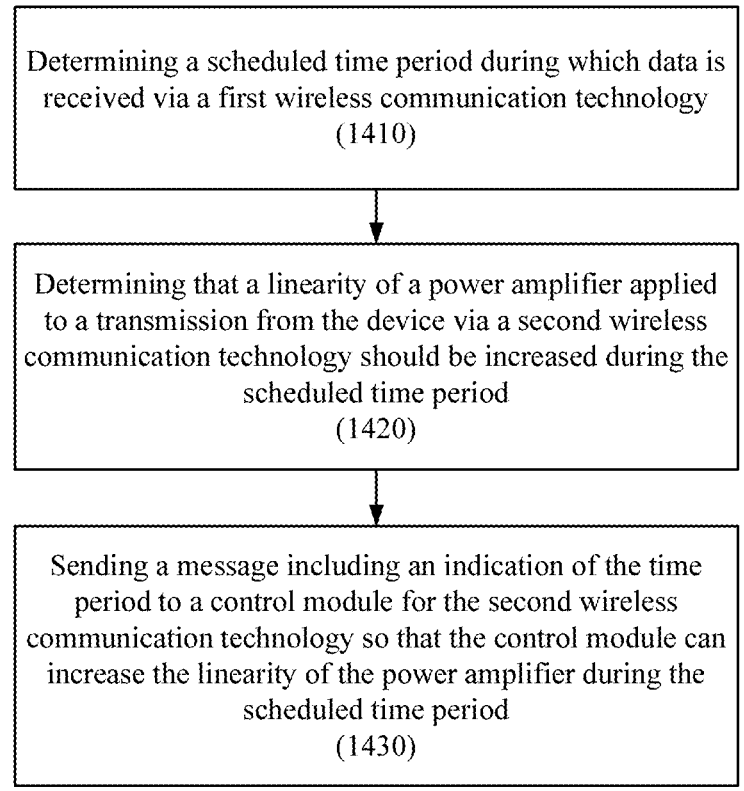
FIG. 14 illustrates a flowchart according to an example method for enabling increasing linearity of a power amplifier to facilitate in-device coexistence between wireless communication technologies according to some example embodiments.

FIG. 14 illustrates a flowchart according to an example method for enabling increasing linearity of a power amplifier to facilitate in-device coexistence between wireless communication technologies according to some example embodiments. Operation 1410 can include determining a scheduled time period during which data is received via a first wireless communication technology. Operation 1420 can include determining that a linearity of a power amplifier applied to a transmission from the device via a second wireless communication technology should be increased during the scheduled time period. Operation 1430 can include sending a message (e.g., via interface 424) including an indication of the time period to a control module for the second wireless communication technology (e.g., aggressor technology control module 420 or aggressor technology chipset 502) so that the control module can increase the linearity of the power amplifier during the scheduled time period. One or more of processing circuitry 410, processor 412, memory 414, victim technology control module 422, and victim technology chipset 512 can, for example, provide means for performing operations 1410-1430.

Figure 15:
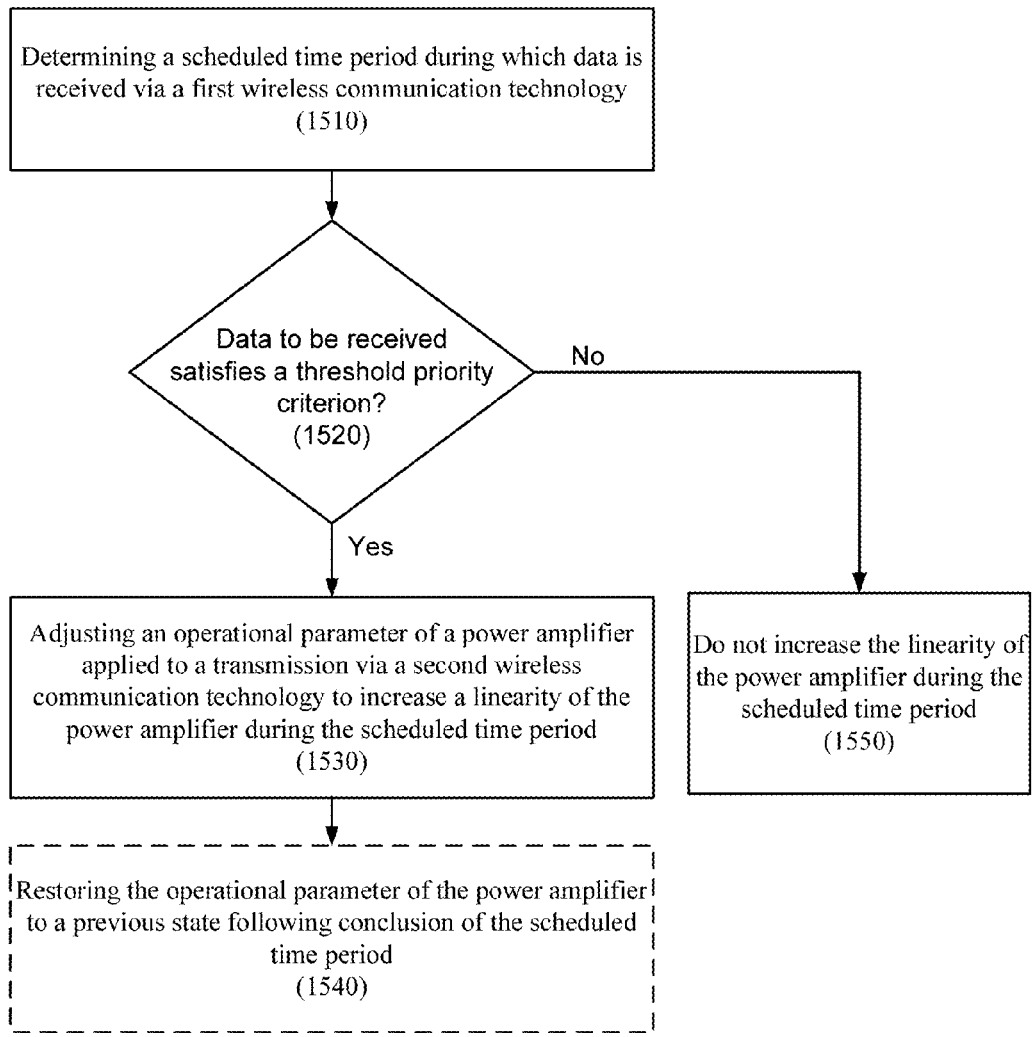
FIG. 15 illustrates a flowchart according to a further example method for increasing linearity of a power amplifier to facilitate in-device coexistence between wireless communication technologies according to some example embodiments.

FIG. 15 illustrates a flowchart according to a further example method for increasing linearity of a power amplifier to facilitate in-device coexistence between wireless communication technologies according to some example embodiments. Operation 1510 can include determining a scheduled time period during which data is received via a first wireless communication technology. Operation 1520 can include determining whether data to be received satisfies a threshold priority criterion. One or more of processing circuitry 410, processor 412, memory 414, victim technology control module 422, and victim technology chipset 512 can, for example, provide means for performing operations 1510-1520.

In an instance in which it is determined at operation 1520 that the data to be received does satisfy a threshold priority criterion, the method can proceed to operation 1530, which can include adjusting an operational parameter of a power amplifier applied to a transmission via a second wireless communication technology to increase a linearity of the power amplifier during the scheduled time period. In some example embodiments, the method of FIG. 15 can further include operation 1540, which can include restoring the operational parameter of the power amplifier to a previous state following conclusion of the scheduled time period. In this regard, the operational parameter can be restored to an initial state, such as a default state, that was used prior to the adjustment of operation 1530. One or more of processing circuitry 410, processor 412, memory 414, aggressor technology transceiver 416, aggressor technology control module 420, and aggressor technology chipset 502 can, for example, provide means for performing operations 1530-1540.

If, however, it is determined at operation 1520 that the data to be received does not satisfy the threshold priority criterion, the method can proceed to operation 1550 rather than performing operation 1530. Operation 1550 can include determining to not increase the linearity of the power amplifier during the scheduled time period.

Figure 16:
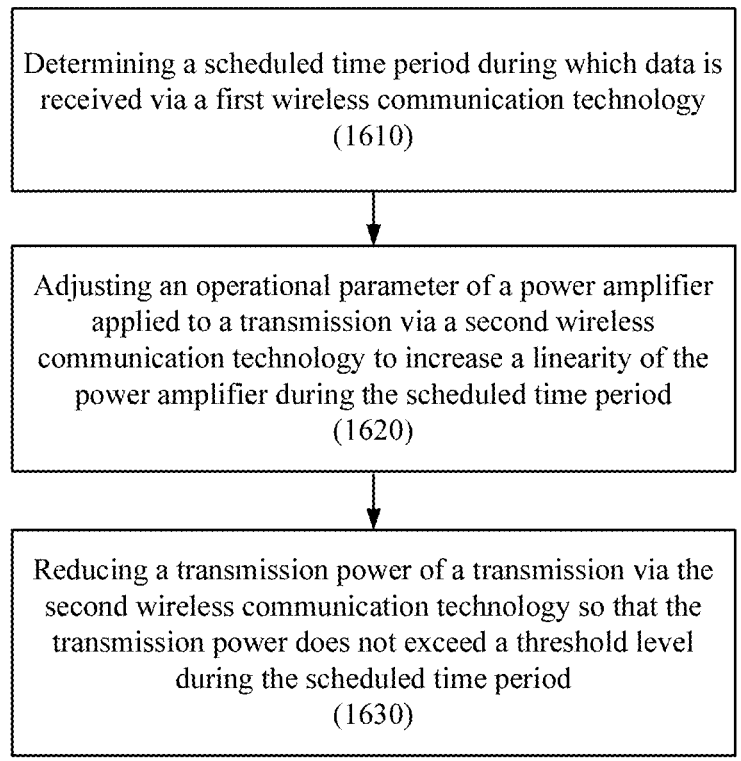
FIG. 16 illustrates a flowchart according to an example method for increasing linearity of a power amplifier and performing transmission power modulation to facilitate in-device coexistence between wireless communication technologies according to some example embodiments.

FIG. 16 illustrates a flowchart according to an example method for increasing linearity of a power amplifier and performing transmission power modulation to facilitate in-device coexistence between wireless communication technologies according to some example embodiments. Operation 1610 can include determining a scheduled time period during which data is received via a first wireless communication technology. One or more of processing circuitry 410, processor 412, memory 414, aggressor technology control module 420, victim technology control module 422, aggressor technology chipset 502, and victim technology chipset 512 can, for example, provide means for performing operation 1610. Operation 1620 can include adjusting an operational parameter of a power amplifier applied to a transmission via a second wireless communication technology to increase a linearity of the power amplifier during the scheduled time period. One or more of processing circuitry 410, processor 412, memory 414, aggressor technology control module 420, and aggressor technology chipset 502 can, for example, provide means for performing operation 1620. Operation 1630 can include reducing a transmission power of a transmission via the second wireless communication technology so that the transmission power does not exceed a threshold level during the scheduled time period. One or more of processing circuitry 410, processor 412, memory 414, aggressor technology transceiver 416, aggressor technology control module 420, and aggressor technology chipset 502 can, for example, provide means for performing operation 1630.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method comprising:
   determining, by a first control module of a mobile device, a scheduled time period when data is scheduled to be received by a first wireless transceiver of the mobile device; and
   adjusting, by a second control module of the mobile device and prior to the scheduled time period, an operational parameter of a power amplifier connected to a second wireless transceiver of the mobile device to increase a linearity of the power amplifier during the scheduled time period when the data is scheduled to be received by the first wireless transceiver.

2. The method of claim 1, wherein adjusting the operational parameter of the power amplifier comprises adjusting a bias current applied to the power amplifier.

3. The method of claim 1, further comprising:
   adjusting, by the second control module, an operational parameter of each of a plurality of power amplifiers in a chain of power amplifiers connected to the second wireless transceiver.

4. The method of claim 1, further comprising:
   receiving, by the second control module, a message from the first control module, the message including an indication of the scheduled time period.

5. The method of claim 1, wherein the operational parameter is exclusively adjusted when the data that is scheduled to be received during the scheduled time period satisfies a threshold priority criterion.

6. The method of claim 5, wherein data that includes a Link Manager Protocol (LMP) message satisfies the threshold priority criterion.

7. The method of claim 1, further comprising:
   reducing, by the second control module, a transmission power of the second wireless transceiver below a threshold level during the scheduled time period.

8. The method of claim 1, wherein the second wireless transceiver is configured to output a cellular transmission in accordance with one of a Long Term Evolution (LTE) cellular communication technology, a Universal Mobile Telecommunications System (UMTS) cellular communication technology, a Global System for Mobile Communications (GSM) cellular communication technology, a Code Division Multiple Access (CDMA) cellular communication technology, or a CDMA 2000 cellular communication technology.

9. An apparatus comprising:
   a first wireless transceiver; and
   processing circuitry coupled to the first wireless transceiver, wherein the processing circuitry is configured to:
      determine a scheduled time period when data is scheduled to be received by a second wireless transceiver of the apparatus; and
      adjust, prior to the scheduled time period, an operational parameter of a power amplifier connected to the first wireless transceiver to increase a linearity of the power amplifier during the scheduled time period when the data is scheduled to be received by the second wireless transceiver.

10. The apparatus of claim 9, wherein the processing circuitry is configured to adjust the operational parameter of the power amplifier by adjusting a bias current applied to the power amplifier.

11. The apparatus of claim 9, wherein the processing circuitry is further configured to:
   return the operational parameter to a default state subsequent to the scheduled time period.

12. The apparatus of claim 9, wherein the processing circuitry is coupled to an interface, and the processing circuitry is further configured to:

receive, via the interface, a message sent by a control module configured to control the second wireless transceiver, the message including an indication of the scheduled time period.

13. The apparatus of claim 12, wherein the interface is connected between a first chipset for the first wireless transceiver and a second chipset for the second wireless transceiver.

14. The apparatus of claim 13, wherein the first chipset for the first wireless transceiver comprises a cellular chipset, and the second wireless transceiver comprises a wireless communication technology utilizing an industrial, scientific, and medical (ISM) band.

15. The apparatus of claim 9, wherein the apparatus is a mobile communication device.

16. A method comprising:
by a processor of a device:
determining a scheduled time period during which data is scheduled to be received by a first wireless transceiver of the device;
determining that a linearity of a power amplifier that provides power to a second wireless transceiver should be increased during the scheduled time period to mitigate interference between the second wireless transceiver and the first wireless transceiver; and
sending a message including an indication of the scheduled time period to a control module for the second wireless transceiver in advance of the scheduled time period to request that the control module adjust an operational parameter of the power amplifier before the scheduled time period to increase the linearity of the power amplifier during the scheduled time period.

17. The method of claim 16, wherein determining that the linearity of the power amplifier should be increased comprises determining that the data scheduled to be received during the scheduled time period satisfies a threshold priority criterion.

18. The method of claim 17, wherein data including a Link Manager Protocol (LMP) message satisfies the threshold priority criterion.

19. The method of claim 16, further comprising determining a plurality of scheduled time periods during which the data is scheduled to be received via the first wireless transceiver and the linearity of the power amplifier should be increased, and wherein the indication comprises the plurality of scheduled time periods.

20. An apparatus comprising:
a first wireless transceiver configured to receive data; and
processing circuitry coupled to the first wireless transceiver, wherein the processing circuitry is configured to:
determine a scheduled time period when data is scheduled to be received by the first wireless transceiver;
determine that a linearity of a power amplifier applied to a transmission from a second wireless transceiver of the apparatus should be increased during the scheduled time period to mitigate interference between the second wireless transceiver and the first wireless transceiver; and
send a message to a control module configured to control the second wireless transceiver, the message including a request to adjust an operational parameter of the power amplifier before the scheduled time period to increase the linearity of the power amplifier during the scheduled time period.

21. The apparatus of claim 20, wherein the processing circuitry is further configured to determine that a transmission power of the second transceiver should be reduced by determining that a control message is scheduled to be received during the scheduled time period.

22. The apparatus of claim 20, wherein an interface is connected between a first chipset for the first wireless transceiver and a second chipset for the second wireless transceiver.

23. The apparatus of claim 22, wherein the apparatus is a mobile communication device.

24. An apparatus comprising:
first control circuitry for a first wireless transceiver;
second control circuitry for a second wireless transceiver; and
an interface configured to enable communication between the first control circuitry and the second control circuitry,
wherein the first control circuitry is configured to:
determine a scheduled time period during which data is scheduled to be received by the first wireless transceiver, and
send a message through the interface to the second control circuitry to request that the second control circuitry increase a linearity of a power amplifier applied to a transmission via the second wireless transceiver during the scheduled time period; and
wherein the second control circuitry is configured to adjust, prior to the scheduled time period, an operational parameter of the power amplifier to increase the linearity of the power amplifier during the scheduled time period when data is scheduled to be received by a device via the first wireless transceiver.

25. The apparatus of claim 24, wherein the first control circuitry is further configured to:
determine whether data scheduled to be received during the scheduled time period comprises data satisfying a threshold priority criterion.

26. The apparatus of claim 24, wherein the second control circuitry is further configured to reduce a transmission power of the transmission below a threshold level during the scheduled time period.

* * * * *